(12) United States Patent
Naito

(10) Patent No.: US 9,929,260 B2
(45) Date of Patent: Mar. 27, 2018

(54) IGBT SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/284,550

(22) Filed: Oct. 4, 2016

(65) Prior Publication Data
US 2017/0025522 A1  Jan. 26, 2017

Related U.S. Application Data

(63) Continuation-in-part of application No. 15/088,135, filed on Apr. 1, 2016.

(30) Foreign Application Priority Data

May 15, 2015 (JP) .................. 2015-100323
Nov. 13, 2015 (JP) .................. 2015-223328

(51) Int. Cl.
*H01L 29/739* (2006.01)
*H01L 29/66* (2006.01)
(Continued)

(52) U.S. Cl.
CPC ...... *H01L 29/7397* (2013.01); *H01L 27/0664* (2013.01); *H01L 29/0619* (2013.01);
(Continued)

(58) Field of Classification Search
CPC ......... H01L 29/76833; H01L 29/76866; H01L 27/082; H01L 27/1022; H01L 29/0817;
(Continued)

(56) References Cited

U.S. PATENT DOCUMENTS 6,180,966 B1   1/2001 Kohno et al.
2002/0177277 A1* 11/2002 Baliga ............... H01L 29/0878
                                                    438/268
(Continued)

FOREIGN PATENT DOCUMENTS

JP    2011-165971 A      8/2011
JP    2011-199101    *  10/2011

OTHER PUBLICATIONS

Office Action issued for related U.S. Appl. No. 15/088,135, issued by United States Patent and Trademark Office dated Feb. 24, 2017.
(Continued)

*Primary Examiner* — Mary Wilczewski
*Assistant Examiner* — Tsz Chiu

(57) ABSTRACT

A semiconductor device includes a semiconductor substrate, a base region formed in the semiconductor substrate on a front surface side thereof, a gate trench extending from a front surface side of the base region and penetrating thorough the base region, and a dummy trench extending from the front surface side of the base region and penetrating thorough the base region, where a portion of the dummy trench that extends beyond a back surface of the base region is longer than a portion of the gate trench that extends beyond the back surface of the base region.

25 Claims, 25 Drawing Sheets

(51) Int. Cl.

| | |
|---|---|
| *H01L 29/423* | (2006.01) |
| *H01L 29/06* | (2006.01) |
| *H01L 29/08* | (2006.01) |
| *H01L 29/36* | (2006.01) |
| *H01L 27/06* | (2006.01) |
| *H01L 29/40* | (2006.01) |
| *H01L 29/10* | (2006.01) |

(52) U.S. Cl.
CPC ...... *H01L 29/0657* (2013.01); *H01L 29/0804* (2013.01); *H01L 29/0834* (2013.01); *H01L 29/36* (2013.01); *H01L 29/407* (2013.01); *H01L 29/4236* (2013.01); *H01L 29/42376* (2013.01); *H01L 29/0623* (2013.01); *H01L 29/0696* (2013.01); *H01L 29/1095* (2013.01)

(58) Field of Classification Search
CPC ........... H01L 29/66234; H01L 29/7375; H01L 29/66674–29/666734; H01L 29/7801–29/7826; H01L 29/04–29/045; H01L 29/16–29/2206; H01L 29/0856–29/0869; H01L 29/0873–29/0886; H01L 29/66712–29/66734; H01L 29/7802–29/7815

See application file for complete search history.

(56) References Cited

U.S. PATENT DOCUMENTS

| | | |
|---|---|---|
| 2002/0179976 A1 | 12/2002 | Takahashi |
| 2004/0041171 A1* | 3/2004 | Ogura ................. H01L 29/0692 257/197 |
| 2007/0040213 A1 | 2/2007 | Hotta et al. |
| 2007/0114598 A1 | 5/2007 | Hotta et al. |
| 2008/0012040 A1 | 1/2008 | Saito et al. |
| 2008/0179666 A1 | 7/2008 | Foerster et al. |
| 2008/0315249 A1 | 12/2008 | Minato et al. |
| 2009/0283797 A1 | 11/2009 | Takahashi et al. |
| 2010/0289076 A1 | 11/2010 | Nishida et al. |
| 2011/0012195 A1 | 1/2011 | Momota et al. |
| 2011/0285427 A1* | 11/2011 | Koyama ............. H01L 29/7391 327/109 |
| 2012/0146091 A1 | 6/2012 | Tanabe et al. |
| 2013/0075784 A1 | 3/2013 | Ikeda |
| 2014/0048847 A1 | 2/2014 | Yamashita et al. |
| 2014/0084332 A1 | 3/2014 | Lee |
| 2015/0206960 A1 | 7/2015 | Hirabayashi et al. |
| 2016/0211319 A1 | 7/2016 | Saito et al. |
| 2016/0351561 A1 | 12/2016 | Senoo |
| 2017/0018635 A1 | 1/2017 | Tsuyuki |

OTHER PUBLICATIONS

Office Action issued for counterpart U.S. Appl. No. 15/088,135, issued by the USPTO dated Nov. 3, 2017.

* cited by examiner

IGBT SEMICONDUCTOR DEVICE

The contents of the following Japanese patent applications are incorporated herein by reference:
NO. 2015-100323 filed on May 15, 2015, and
NO. 2015-223328 filed on Nov. 13, 2015.

BACKGROUND

1. Technical Field

The present invention relates to a semiconductor device.

2. Related Art

In the conventional art, it is known to use trench gates and dummy trenches in semiconductor devices such as an IGBT (see, for example, Japanese Patent Application Publication Nos. 2002-353456, 2009-277792 and 2011-165971. The use of the dummy trenches can increase the injection enhanced effects (the IE effects) for the drift region and reduce the on-voltage.

As the trench gates and dummy trenches become deeper, the IE effects can be increased. Such deep trenches, however, results in a shorter distance between the gate and the collector at the back surface, which increases the collector-gate capacitance. The increased collector-gate capacitance results in increased turn-on power loss and degraded gate controllability.

SUMMARY

An aspect of the innovations may include a semiconductor device including a semiconductor substrate, a base region formed in the semiconductor substrate on a front surface side thereof, a gate trench extending from a front surface side of the base region and penetrating thorough the base region, and a dummy trench extending from the front surface side of the base region and penetrating thorough the base region, where a portion of the dummy trench that extends beyond a back surface of the base region is longer than a portion of the gate trench that extends beyond the back surface of the base region.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
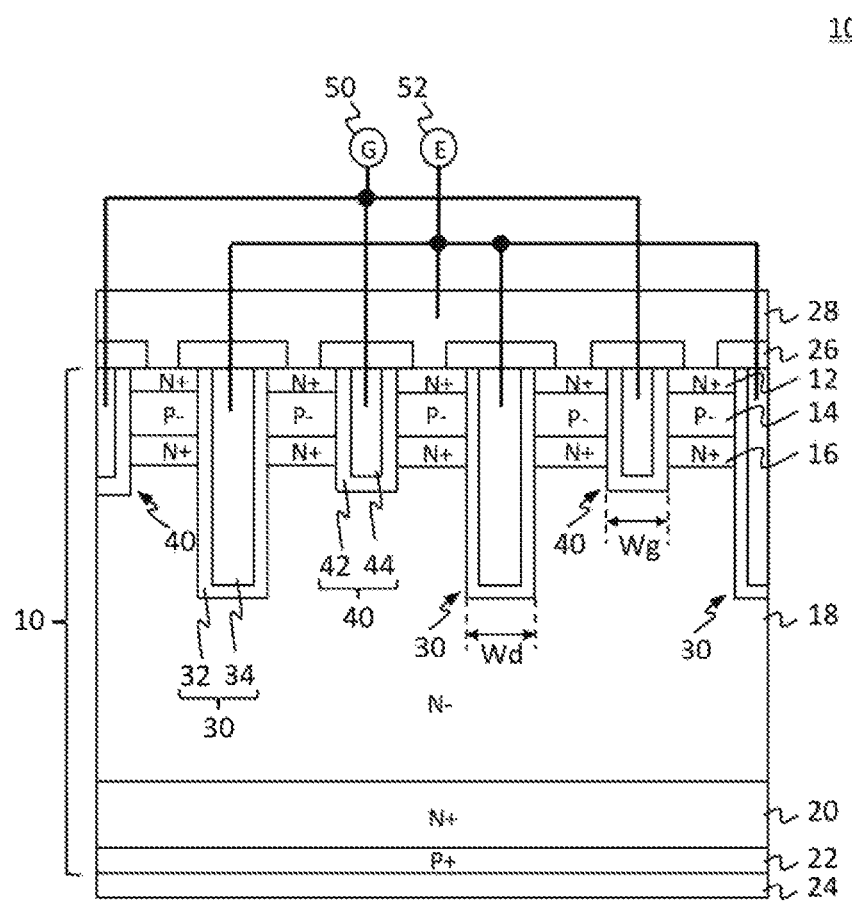
FIG. 1 shows an exemplary cross-section of a semiconductor device 100 relating to a first embodiment.

FIG. 1 shows an exemplary cross-section of a semiconductor device 100 relating to a first embodiment. The semiconductor device 100 is a vertical semiconductor device having electrodes formed on the front and back surfaces of a substrate. In the present example, the semiconductor device 100 includes an insulated gate bipolar transistor (IGBT). The semiconductor device 100 relating to the first embodiment includes a semiconductor substrate 10, a collector electrode 24, an emitter electrode 28 and an insulative layer 26.

While FIG. 1 shows the active region of the semiconductor device 100, the semiconductor device 100 may include an edge termination structure surrounding the active region. The active region denotes the region through which currents flow when the semiconductor device 100 is turned on. The edge termination structure is configured to reduce concentration of electrical fields in the semiconductor substrate 10 on the front surface side thereof. The edge termination structure includes, for example, guard rings, field plates, RESURFs (reduced surface fields) and combinations thereof.

The emitter electrode 28 is formed on the front surface of the semiconductor substrate 10. The emitter electrode 28 is electrically connected to an emitter terminal 52. The collector electrode 24 is formed on the back surface of the semiconductor substrate 10. The collector electrode 24 is electrically connected to a collector terminal. The emitter electrode 28 and the collector electrode 24 are made of an electrically conductive material such as a metal. As used herein, one of the surfaces of a component such as a substrate, a layer, and a region which is closer to the emitter electrode 28 is referred to as the front surface of the component, and the other surface closer to the collector electrode 24 is referred to as the back surface or bottom of the component.

The semiconductor substrate 10 may be a silicon substrate, or a silicon carbide substrate, a nitride semiconductor substrate such as a gallium nitride substrate or the like. A base region 14 of a first conductivity type is formed in the semiconductor substrate 10 on the front surface side thereof. In addition, an emitter region 12 of a second conductivity type is selectively formed in a partial region on the front surface side of the base region 14. In the present example, the first conductivity type is the P-type and the second conductivity type is the N-type. However, the first conductivity type may be the N-type and the second conductivity type may be the P-type.

The semiconductor substrate 10 further includes an accumulation region 16 of the second conductivity type, a drift layer 18 of the second conductivity type, a buffer layer 20 of the second conductivity type, and a collector layer 22 of the first conductivity type. The accumulation region 16 is formed in the base region 14 on the back surface side thereof. The impurity concentration of the accumulation region 16 may be higher than that of the drift layer 18.

The drift layer 18 is formed on the back surface of the accumulation region 16. The buffer layer 20 is formed on the back surface of the drift layer 18. The impurity concentration of the buffer layer 20 is higher than that of the drift layer 18. The buffer layer 20 may serve as a field stop layer that prevents the depletion layer extending from the back surfaces of the base region 14 from reaching the collector layer 22. The collector layer 22 is formed on the back surface of the buffer layer 20. On the back surface of the collector layer 22, the collector electrode 24 is formed.

One or more gate trenches 40 and one or more dummy trenches 30 are formed in the semiconductor substrate 10 on the front surface thereof. The gate trenches 40 penetrate through the base region 14 and extend from the front surface side of the base region 14. In the present example, the gate trenches 40 extend from the front surface of the semiconductor substrate 10, penetrate through the emitter region 12, the base region 14 and the accumulation region 16 and reach the drift layer 18. The gate trenches 40 each include a groove formed in the semiconductor substrate 10 on the front surface side thereof, an insulating film 42 and an electrically conductive portion 44.

The insulating film 42 is formed to cover the inner wall of the groove. The insulating film 42 may be formed by oxidizing or nitrogenating the semiconductor material of the inner wall of the groove. The electrically conductive portion 44 is formed inside the insulating film 42 within the groove. In other words, the insulating film 42 insulates the electrically conductive portion 44 and the semiconductor substrate 10 from each other. The electrically conductive portion 44 is made of an electrically conductive material such as poly silicon.

The electrically conductive portion 44 at least includes a region opposing an adjacent base region 14. Each electrically conductive portion 44 is electrically connected to a gate terminal 50. In response to application of a predetermined voltage to the electrically conductive portion 44 through the gate terminal 50, a channel is formed in the surface layer of the base region 14 that is in contact with the groove.

The dummy trenches 30 penetrate through the base region 14 and extend from the front surface side of the base region 14. In the present example, the dummy trenches 30 extend from the front surface of the semiconductor substrate 10, penetrate through the emitter region 12, the base region 14 and the accumulation region 16, and reach the drift layer 18. As with the gate trenches 40, the dummy trenches 30 each include a groove formed in the semiconductor substrate 10 on the front surface side thereof, an insulating film 32 and an electrically conductive portion 34. The insulative layer 26 is formed between the electrically conductive portions 34 and 44 in the grooves and the emitter electrode 28. However, the insulative layer 26 may not be formed between the electrically conductive portions 34 and the emitter electrode 28.

In the present example, the gate trenches 40 and the dummy trenches 30 are alternately arranged to be adjacent to each other in a predetermined direction as shown in FIG. 1. The respective trenches may be arranged at even intervals. However, the arrangement of the respective trenches is not limited to the above-described example. More than one gate trench 40 may be arranged between two dummy trenches 30. Furthermore, different numbers of gate trenches 40 may be arranged between respective pairs of the dummy trenches 30.

The portion of each dummy trench 30 that extends beyond the back surface of the base region 14 is longer than the portion of each gate trench 40 that extends beyond the back surface of the base region 14. In other words, the distance between the dummy trench 30 and the collector electrode 24 is shorter than the distance between the gate trench 40 and the collector electrode 24.

The length of the portion of each dummy trench 30 that extends beyond the back surface of the base region 14 may be equal to or longer than twice, or equal to or longer than triple the length of the portion of each gate trench 40 that extends beyond the back surface of the base region 14. Alternatively, the length of the portion of each dummy trench 30 that extends beyond the back surface of the base region 14 may be equal to or shorter than five or six times the length of the portion of each gate trench 40 that extends beyond the back surface of the base region 14.

The length of the dummy trench 30 from the top thereof to the bottom thereof may be no less than 5 µm and no more than 10 µm. The length of the gate trench 40 from the opening thereof to the bottom thereof may be no less than 2

μm and no more than 6 μm. It should be noted that the gate trench 40 is shorter than the dummy trench 30. In the present example, the dummy trench 30 has a length of 8 μm, the gate trench 40 has a length of 5 μm and the back surface of the base region 14 is 3.5 μm deep.

The semiconductor device 100 of the present example can achieve increased IE effects since the dummy trenches 30 are configured longer than the gate trenches 40. Accordingly, the present example can accomplish a lowered on-voltage. In addition, since the semiconductor device 100 of the present example can keep a sufficiently long distance between the gate trench 40 and the collector electrode 24, the semiconductor device 100 of the present example can achieve increased IE effects without increasing the collector-gate capacitance.

The accumulation region 16 is formed closer in the depth direction to the base region 14 than the bottom of the dummy trench 30 is. The bottom surface of the accumulation region 16 may be positioned closer to the front surface of the substrate than the bottom of the dummy trench 30 is. The accumulation region 16 is formed between adjacent trenches. In the present example, the accumulation region 16 is formed between the dummy trench 30 and the gate trench 40. The accumulation region 16 may cover the entire region between the dummy trench 30 and the gate trench 40. The existence of the accumulation region 16 can help increase the IE effects and reduce the on-voltage.

The electrically conductive portion 34 of the dummy trench 30 is electrically insulated from the electrically conductive portion 44 of the gate trench 40. This reduces the gate capacitance of the semiconductor substrate 10 per unit area. The electrically conductive portion 34 of the dummy trench 30 may be electrically connected to the emitter terminal 52 or emitter electrode 28.

The intervals between adjacent dummy trenches 30 may be no more than 4 μm. Alternatively, the intervals between adjacent trenches may be no more than 2 μm. The intervals is calculated as the distance between the centers of adjacent trenches. With such a configuration, the present example can accomplish a lowered on-voltage while maintaining the edge termination.

The gate trench 40 and the dummy trench 30 penetrate through the same layer-like base region 14. For example, the portion of the base region 14 through which the gate trench 40 is formed has the same thickness as the portion of the base region 14 through which the dummy trench 30 is formed. The portion of the base region 14 through which the trench is formed may indicate the portion of the base region 14 that is adjacent to the trench. Stated differently, the portion of the base region 14 that is in contact with the gate trench 40 may have the same thickness as the portion of the base region 14 that is in contact with the dummy trench 30.

At the front surface of the semiconductor substrate 10, the opening width Wg of the gate trench 40 is smaller than the opening width Wd of the dummy trench 30. Here, the term "opening width" may denote the maximum width of the opening. When the opening is shaped like a circle, the opening width indicates the diameter of the circle. With such a configuration, the same single step can form grooves for both the gate trenches 40 and the dummy trenches 30. To be specific, since the opening width Wd of the dummy trench 30 is designed to be larger, if the same single etching step is performed to form the grooves for the gate trench 40 and the dummy trench 30, the length of the dummy trench 30 can be made larger than the length of the gate trench 40. Thus, the gate trench 40 and the dummy trench 30 having different lengths can be easily formed.

Figure 2:
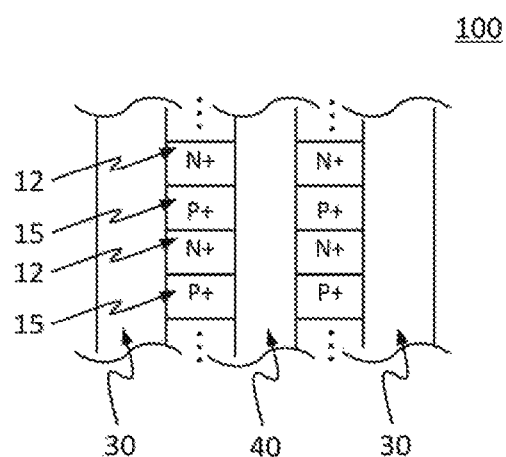
FIG. 2 shows part of the surface of the semiconductor device 100.

FIG. 2 shows part of the surface of the semiconductor device 100. It should be, however, noted that the structure of the surface of the semiconductor device 100 is not limited to the example shown in FIG. 2. FIG. 2 does not show the emitter electrode 28 and the insulative layer 26. The gate trench 40 and the dummy trench 30 respectively extend in predetermined directions. The gate trench 40 and the dummy trench 30 are arranged at predetermined intervals along a predetermined direction.

The base region 14 is formed in the region sandwiched between the trenches. A P$^+$-type contact region 15 is formed on the surface of the base region 14. The emitter region 12 is selectively formed in part of the surface of the contact region 15. The contact region 15 and the emitter region 12 extend from one of adjacent trenches to the other. In the region sandwiched between any adjacent trenches, the contact region 15 and the emitter region 12 are alternately externally exposed along the direction in which the trenches extend.

The following describes an exemplary method of manufacturing the semiconductor device 100 relating to the first embodiment. Note that, however, the method of manufacturing the semiconductor device 100 is not limited to the following exemplary method. To start with, a semiconductor substrate is provided which has the same conductivity type as the drift layer 18 (in the present exemplary embodiment, N$^-$-type). Following this, an etching mask having a predetermined pattern is provided on the front surface of the semiconductor substrate to form a plurality of grooves for the gate trenches 40 and the dummy trenches 30.

In the etching mask, the openings to form the gate trenches 40 have a smaller width than the openings to form the dummy trenches 30. After grooves are formed, an insulating film is formed on the inner walls of the grooves, and the grooves are then filled with an electrically conductive material.

Subsequently, P-type impurities are injected into the semiconductor substrate from the front surface side thereof. The semiconductor substrate is then thermally treated for approximately two hours at a temperature of approximately 1100° C. As a result, a P-type base region, which has a smaller depth than the trenches, is formed across the entire front surface of the semiconductor substrate. Following this, N-type impurities are injected into the semiconductor substrate from the front surface side thereof to form an N-type accumulation region at a deeper position than the base region but a shallower position than the bottom of the trenches. For example, the N-type accumulation region is formed by implanting phosphorous ions with the accelerating voltage of approximately 2.8 MeV and at a dose of approximately $5.0 \times 10^{12}/cm^2$.

After this, a mask having therein openings positioned corresponding to the emitter regions 12 is used to selectively inject N-type impurities into the semiconductor substrate from the front surface side thereof. This selectively forms N$^+$-type emitter regions in the P-type base region. Following this, electrodes, an inter-layer insulating film and the like are formed as appropriate on the front surface of the semiconductor substrate. In the inter-layer insulating film, contact holes are formed at predetermined intervals so as to be adjacent to each other in the longitudinal direction of the trenches. The contact holes are used to connect the emitter electrode to the N$^+$-type emitter regions and the P-type base region.

Subsequently, selenium (Se) ions are implanted into the semiconductor substrate from the back surface side thereof at a concentration of, for example, approximately $1.0 \times 10^{14}$/ cm², and the semiconductor substrate is then thermally treated for approximately two hours at a temperature of approximately 900° C. This forms an N⁺-type buffer layer in the semiconductor substrate on the back surface side thereof. The unchanged N⁻-type region of the semiconductor substrate is treated as the drift layer. The buffer layer can be formed at a deep position due to the use of selenium, which exhibits a high diffusion coefficient. The semiconductor substrate may be subjected to polishing before the buffer layer is formed in order to adjust the thickness.

Instead of implanting selenium ions, the N⁺-type buffer layer may be formed by performing ion implantation of protons at a plurality of times at different doses. This can form a buffer layer in which the impurity concentration increases in the semiconductor substrate from the front surface side to the back surface side.

Following this, ion implantation of P-type impurities is performed from the back surface side of the semiconductor substrate at a dose of, for example, no less than $1.0 \times 10^{13}$/cm² and no more than $4.0 \times 10^{13}$/cm². This can form a P⁺-type collector layer having a smaller thickness than the buffer layer in the semiconductor substrate on the back surface side thereof. The dose of less than $1.0 \times 10^{13}$/cm² for the P-type impurities is not desirable since the collector layer and the collector electrode cannot form ohmic junction. After this, the collector electrode and the like are formed on the back surface side of the semiconductor substrate as needed.

Figure 3:
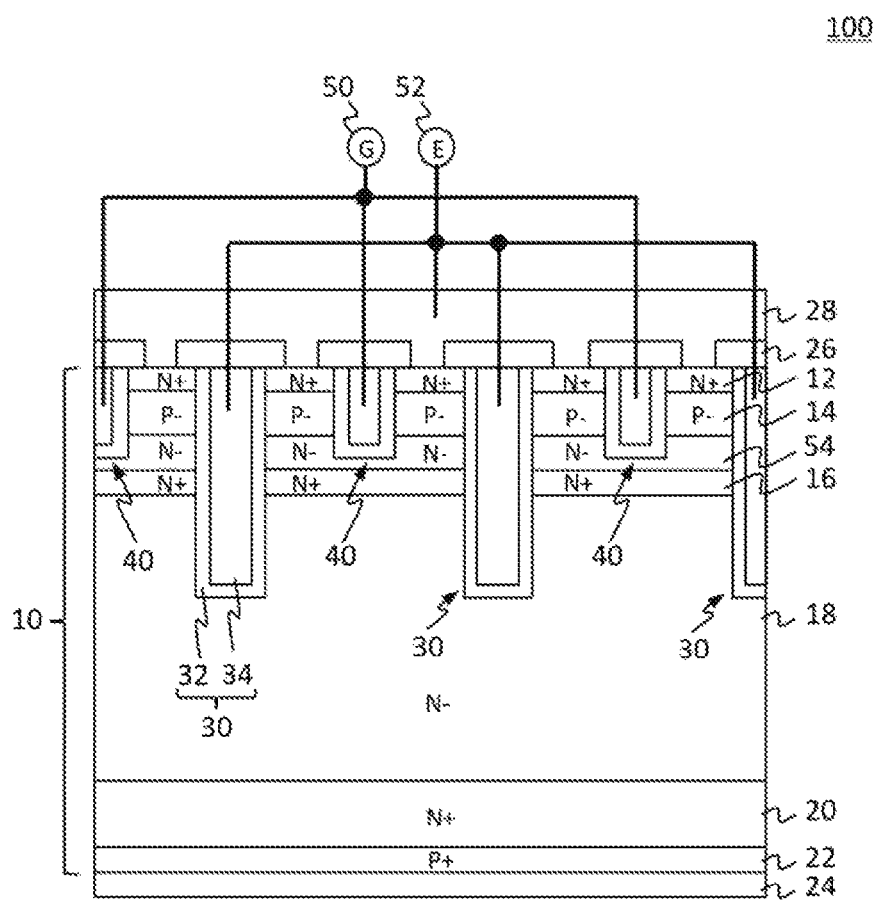
FIG. 3 shows an exemplary cross-section of a semiconductor device 100 relating to a second embodiment.

FIG. 3 shows an exemplary cross-section of a semiconductor device 100 relating to a second embodiment. The semiconductor device 100 relating to the second embodiment further includes a low-concentration region 54 of the second conductivity type in addition to the components of the semiconductor device 100 relating to the first embodiment. In addition, the accumulation region 16 is differently positioned in the second embodiment. Except for these, the semiconductor device 100 relating to the second embodiment may be the same as the semiconductor device 100 relating to the first embodiment.

In the second embodiment, the accumulation region 16 is positioned closer to the back surface of the semiconductor device 100 than the bottom of the gate trench 40 is and spaced away from the gate trench 40. Furthermore, the accumulation region 16 is positioned closer to the front surface of the semiconductor device 100 than the bottom of the dummy trench 30 is. In the second embodiment, the accumulation region 16 extends from one of adjacent dummy trenches 30 to the other. In other words, the accumulation region 16 may extend the entire region between two adjacent dummy trenches 30.

The distance between the accumulation region 16 and the bottom of the gate trench 40 is, for example, no less than 0.5 μm and approximately no more than 2 μm. This distance may be 1 μm or less. In the second embodiment, the dummy trench 30 has a length of 8 μm, the gate trench 40 has a length of 2.8 μm, and the back surface of the accumulation region 16 is 3.5 μm deep. The accumulation region 16 of the second embodiment can be formed by injecting phosphorous from the front surface side of the semiconductor substrate 10, for example, with the accelerating voltage of approximately 6.0 MeV and at a dose of approximately $1.0 \times 10^{13}$/cm².

The low-concentration region 54 is formed between the accumulation region 16 and the bottom of the gate trench 40. The low-concentration region 54 is also formed between the accumulation region 16 and the base region 14. The low-concentration region 54 has a lower impurity concentration than the accumulation region 16.

Since the gate trench 40 is not in contact with the accumulation region 16 in the semiconductor device 100 of the second embodiment, the collector-gate capacitance does not increase transiently when the semiconductor device 100 is turned on. This means that the parameter di/dt does not increase when the semiconductor device 100 is turned on.

Figure 4:
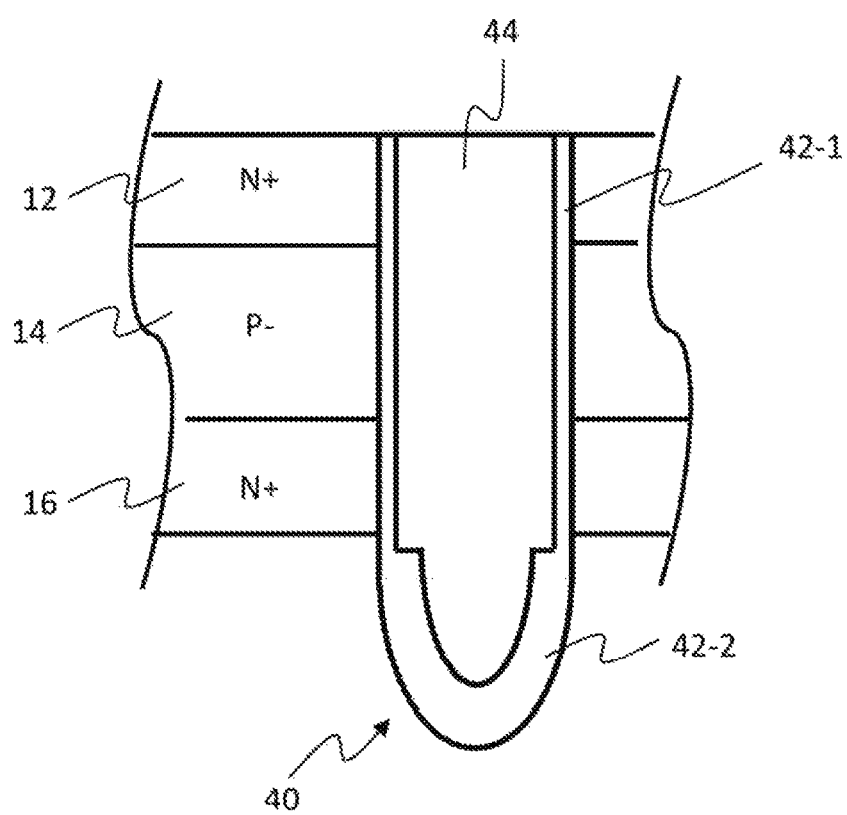
FIG. 4 shows an exemplary structure of a gate trench 40.

FIG. 4 shows an exemplary structure of the gate trench 40. In the present example, the gate trench 40 has a first insulating film 42-1, a second insulating film 42-2 and an electrically conductive portion 44. The first insulating film 42-1 extends from the groove opening at the front surface of the semiconductor substrate 10 to a predetermined depth. The length of the first insulating film 42-1 may be equal to or longer than half the length of the gate trench 40. The second insulating film 42-2 extends from the bottom of the groove to the bottom of the first insulating film 42-1.

In the present example, the second insulating film 42-2 is thicker than the first insulating film 42-1. In other words, the insulating film 42 formed at the bottom of the groove is thicker than the insulating film 42 formed at the opening of the groove at the front surface of the semiconductor substrate 10. The first insulating film 42-1 may have a substantially constant thickness.

Electrical fields tend to concentrate at the bottom of the gate trench 40, which is sandwiched between long dummy trenches 30. To deal with this issue, a thick insulating film 42 is formed at the bottom of the gate trench 40 in the present example. In this manner, the edge termination of the gate trench 40 can be maintained.

The insulating film 42 that is formed on the groove bottom side with respect to the bottom of the accumulation region 16 may be at least partially thicker than the insulating film 42 that is formed on the groove opening side with respect to the bottom of the accumulation region 16. In the present example, the second insulating film 42-2 is formed on the groove bottom side with respect to the bottom of the accumulation region 16.

Figure 5:
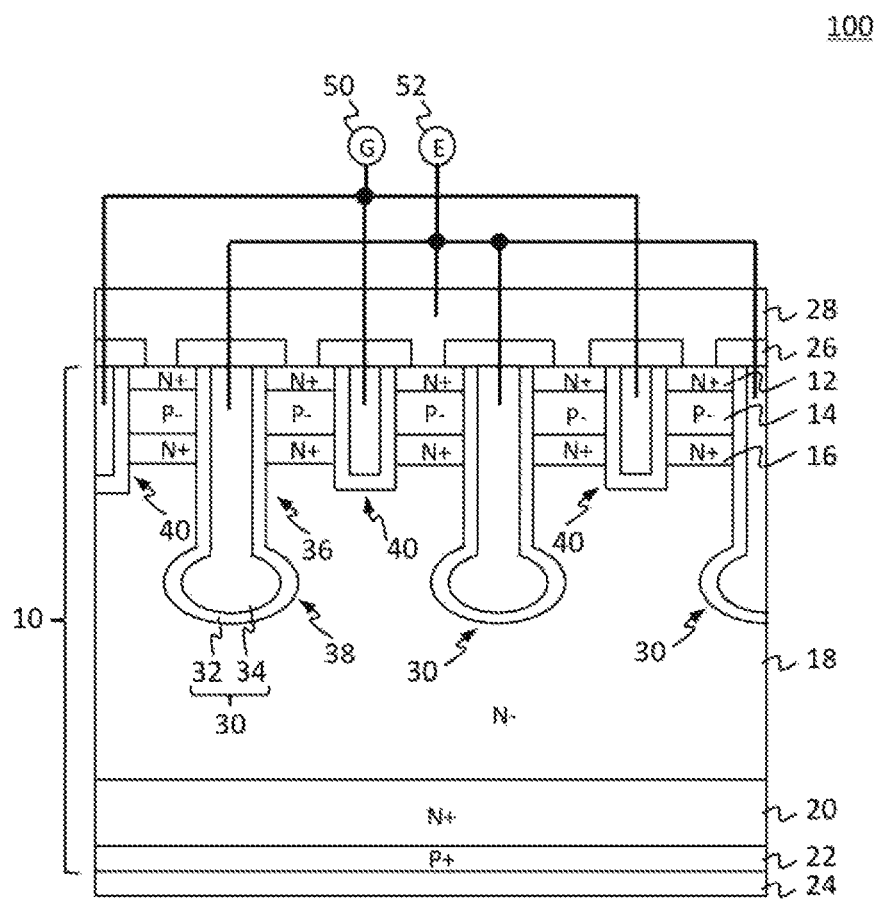
FIG. 5 shows an exemplary cross-section of a semiconductor device 100 relating to a third embodiment.

FIG. 5 shows an exemplary cross-section of a semiconductor device 100 relating to a third embodiment. The semiconductor device 100 relating to the third embodiment is different from the semiconductor device 100 relating to the first embodiment in that the dummy trench 30 has a different shape. Except for this, the semiconductor device 100 relating to the third embodiment may be the same as the semiconductor device 100 relating to the first embodiment.

The dummy trench 30 relating the third embodiment has a front-side portion 36 and a bottom-side portion 38. The front-side portion 36 extends from the front surface of the semiconductor substrate 10, and the bottom-side portion 38 is positioned closer to the bottom of the groove than the front-side portion 36 is and has a larger width than the front-side portion 36. The front-side portion 36 may have a substantially constant width. The maximum width of the bottom-side portion 38 may be equal to or larger than approximately one-and-a-half times the maximum width of the front-side portion 36, and equal to or smaller than approximately three times the maximum width of the front-side portion 36.

The bottom-side portion 38 may be shaped in such a manner that the width continuously varies as shown in FIG. 5 or that the width varies in a stepwise fashion. The bottom-side portion 38 of each dummy trench 30 is positioned at the same depth. The bottom-side portion 38 is closer to the back surface of the semiconductor substrate 10 than either of the bottom of the gate trench 40 and the bottom of the accumulation region 16 is.

The above-described configuration allows the mesa between the dummy trenches 30 to be made narrower from the viewpoint of the collector layer 22. As a result, the IE effects can be further improved. In the present example, the insulating film 32 of the dummy trench 30 may have a uniform thickness in the front-side portion 36 and in the bottom-side portion 38.

Figure 6:
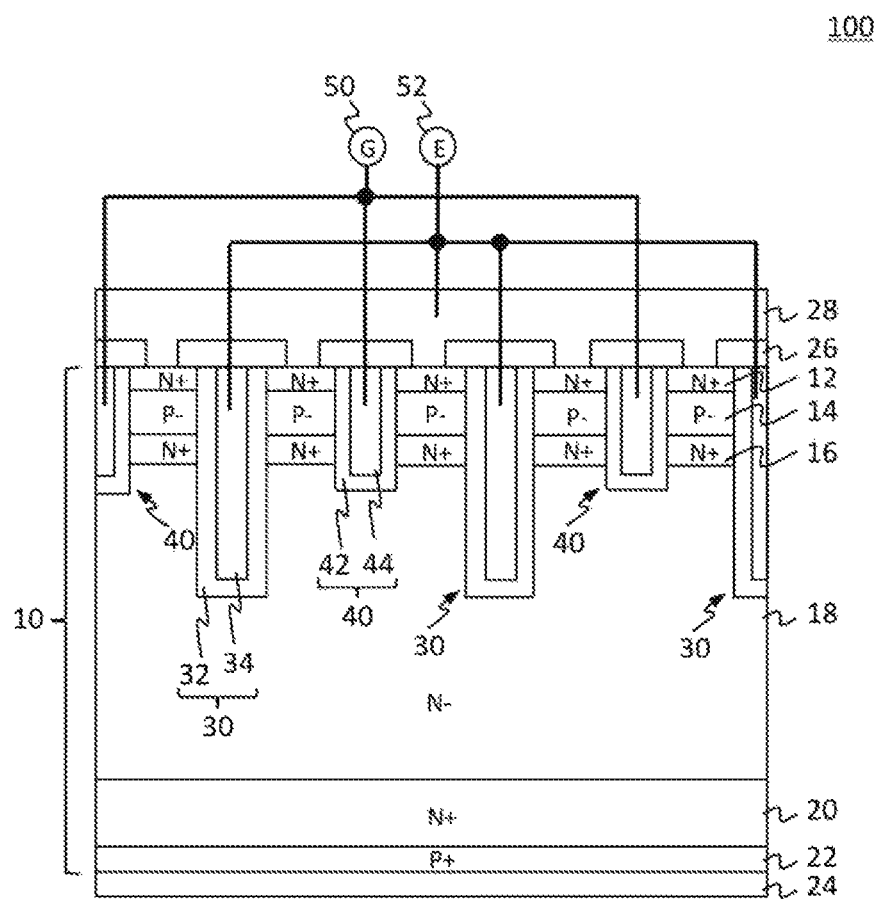
FIG. 6 shows an exemplary cross-section of a semiconductor device 100 relating to a fourth embodiment.

FIG. 6 shows an exemplary cross-section of a semiconductor device 100 relating to a fourth embodiment. The semiconductor device 100 relating to the fourth embodiment is different from the semiconductor devices 100 relating to the first to third embodiments in terms of the thickness of the insulating film 32 of the dummy trench 30. Except for this, the semiconductor device 100 relating to the fourth embodiment may be the same as the semiconductor devices 100 relating to the first to third embodiments.

In the present example, the insulating film 32 formed at the bottom of the dummy trench 30 is thicker than the insulating film 42 of the gate trench 40. The insulating film 32 formed at the bottom of the dummy trench 30 may be thicker than the minimum thickness of the insulating film 42 and thicker than the maximum thickness of the insulating film 42.

Since the dummy trench 30 extends further towards the back surface of the semiconductor substrate 10 than the gate trench 40 does, the electrical fields tend to concentrate on the bottom of the dummy trench 30. The dummy trench 30 relating to the fourth embodiment can help maintain the edge termination due to the thick insulating film 32 at the bottom of the dummy trench 30. Note that the entire insulating film 32 of the dummy trench 30 may be thicker than the insulating film 42 of the gate trench 40. The insulating film 32 of the dummy trench 30 may have a uniform thickness.

Figure 7:
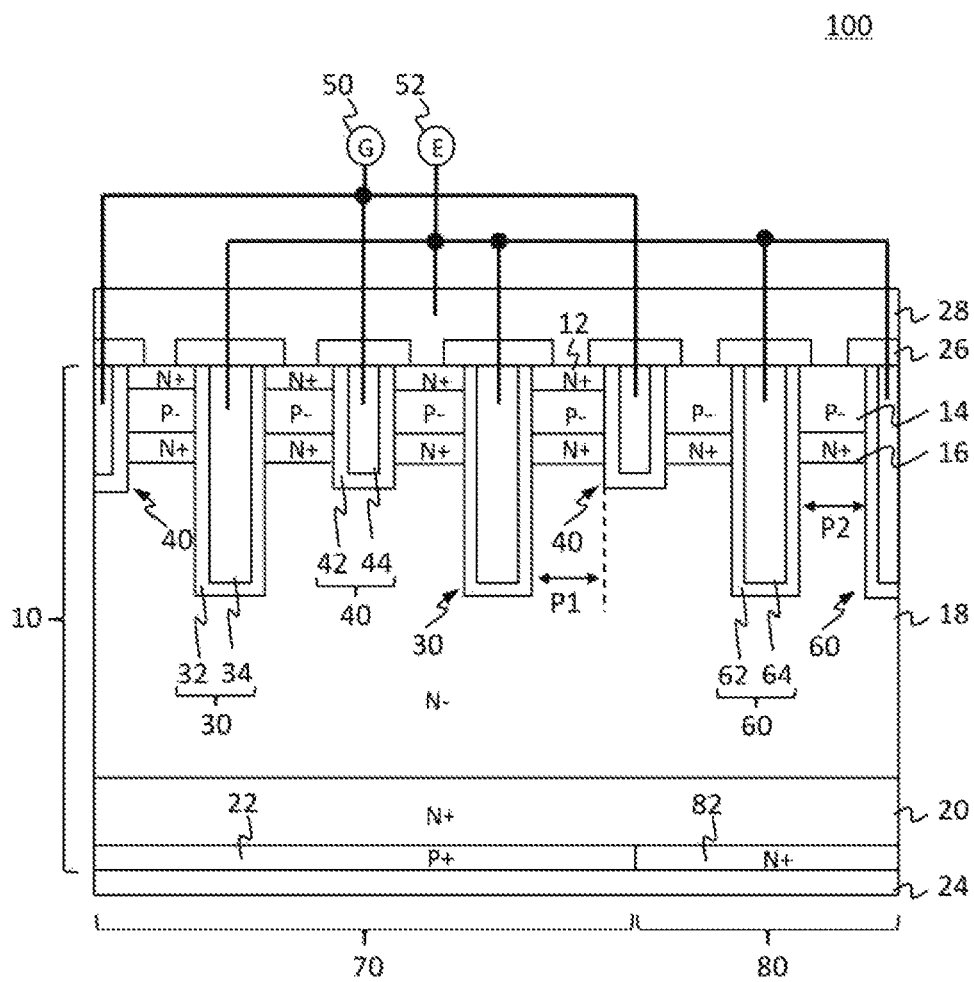
FIG. 7 shows an exemplary cross-section of a semiconductor device 100 relating to a fifth embodiment.

FIG. 7 shows an exemplary cross-section of a semiconductor device 100 relating to a fifth embodiment. The semiconductor substrate 10 relating to the fifth embodiment includes a transistor portion 70 and a diode portion 80. The transistor portion 70 has the same configuration as the semiconductor substrates 10 relating to the first to fourth embodiments.

The diode portion 80 is adjacent to the transistor portion 70. The diode portion 80 includes the base region 14, the accumulation region 16, the drift layer 18 and the buffer layer 20, which are the same as the corresponding regions and layers of the transistor portion 70. In the diode portion 80, a cathode layer 82 is provided on the back surface of the buffer layer 20, one or more emitter trenches 60 are included and the emitter region 12 is not formed.

The emitter trenches 60 each extend from the front surface side of the base region 14, penetrates through the base region 14, and reaches the drift layer 18. The emitter trench 60 includes an insulating film 62 and an electrically conductive portion 64 like the gate trench 40.

In the fifth embodiment, each emitter trench 60 extends the same length beyond the back surface of the base region 14. The emitter trench 60 may have the same length as the dummy trench 30.

Figure 8:
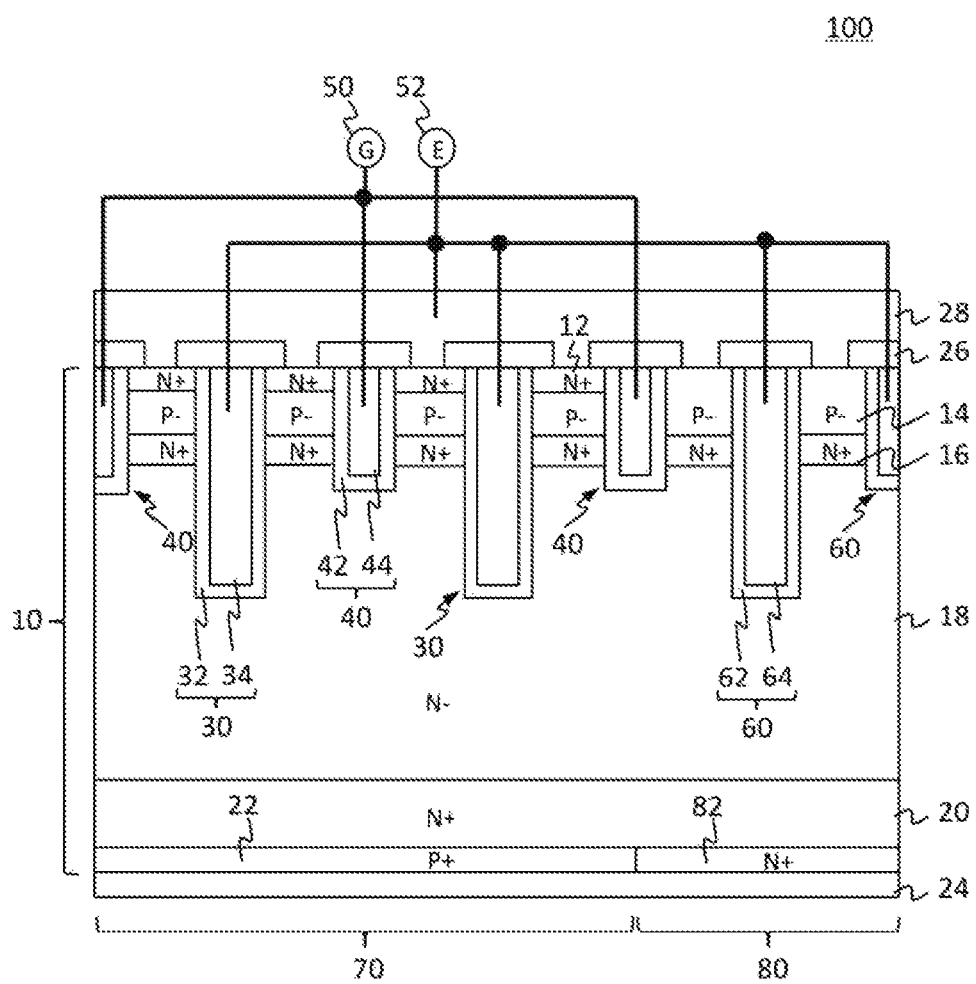
FIG. 8 shows an exemplary cross-section of a semiconductor device 100 relating to a sixth embodiment.

According to the fifth embodiment, the intervals P1 between the trenches in the transistor portion 70 is the same as the intervals P2 between the emitter trenches 60 in the diode portion 80. When the gate trenches 40 and the dummy trenches 30 are alternately arranged in the transistor portion 70 as shown in FIG. 7, the intervals P1 between the gate trench 40 and the dummy trench 30 may be the same as the intervals P2 between the emitter trenches 60. The insulating film 62 of the emitter trench 60 may have the same thickness as the insulating film 42 of the gate trench 40. FIG. 8 shows an exemplary cross-section of a semiconductor device 100 relating to a sixth embodiment. The semiconductor device 100 relating to the sixth embodiment is different from the semiconductor device 100 relating to the fifth embodiment in terms of the length of the emitter trench 60. Except for this, the semiconductor device 100 relating to the sixth embodiment may be the same as the semiconductor device 100 relating to the fifth embodiment.

In the sixth embodiment, the emitter trench 60 also extends from the front surface side of the base region 14, penetrates through the base region 14 and reaches the drift layer 18, but the diode portion 80 includes a plurality of emitter trenches 60 that extend various lengths beyond the back surface of the base region 14.

For example, at least one of the emitter trenches 60 in the diode portion 80 extends, beyond the back surface of the base region 14, the same length as the gate trench 40 extends beyond the back surface of the base region 14. In addition, another at least one of the emitter trenches 60 extends, beyond the back surface of the base region 14, the same length as the dummy trench 30 extends beyond the back surface of the base region 14. The emitter trenches 60 having the same length as the gate trench 40 and the emitter trenches 60 having the same length as the dummy trench 30 may be alternately arranged.

Figure 9:
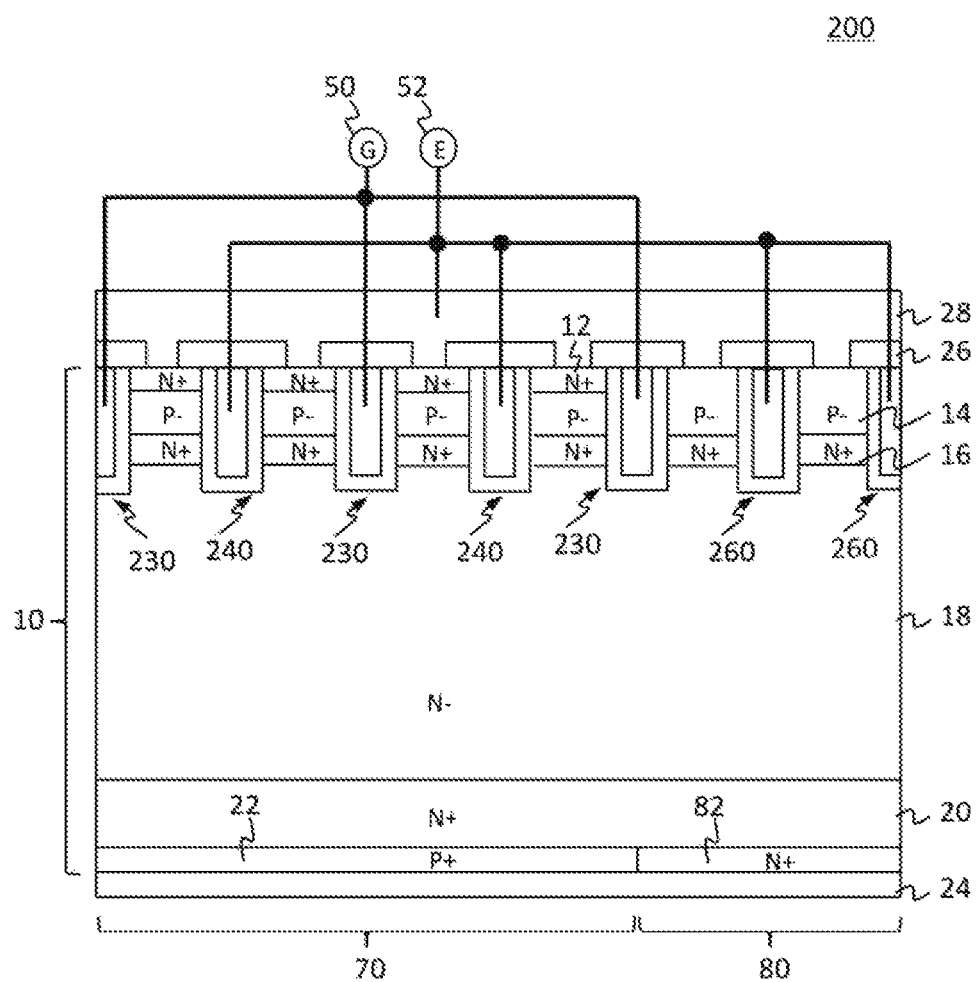
FIG. 9 shows an exemplary structure of a semiconductor device 200 relating to a first comparative example.

FIG. 9 shows an exemplary structure of a semiconductor device 200 relating to a first comparative example. The semiconductor device 200 relating to the first comparative example is different from the semiconductor device 100 shown in FIG. 7 or 8 in terms of the lengths of the trenches. In the semiconductor device 200 relating to the first comparative example, the gate trenches 240, the dummy trenches 230 and the emitter trenches 260 have the same length as the gate trenches 40 of the semiconductor device 100 shown in FIG. 7 or 8. The semiconductor device 200 relating to the first comparative example produces poor IE effects since the trenches are shallow, which results in a high on-voltage.

Figure 10:
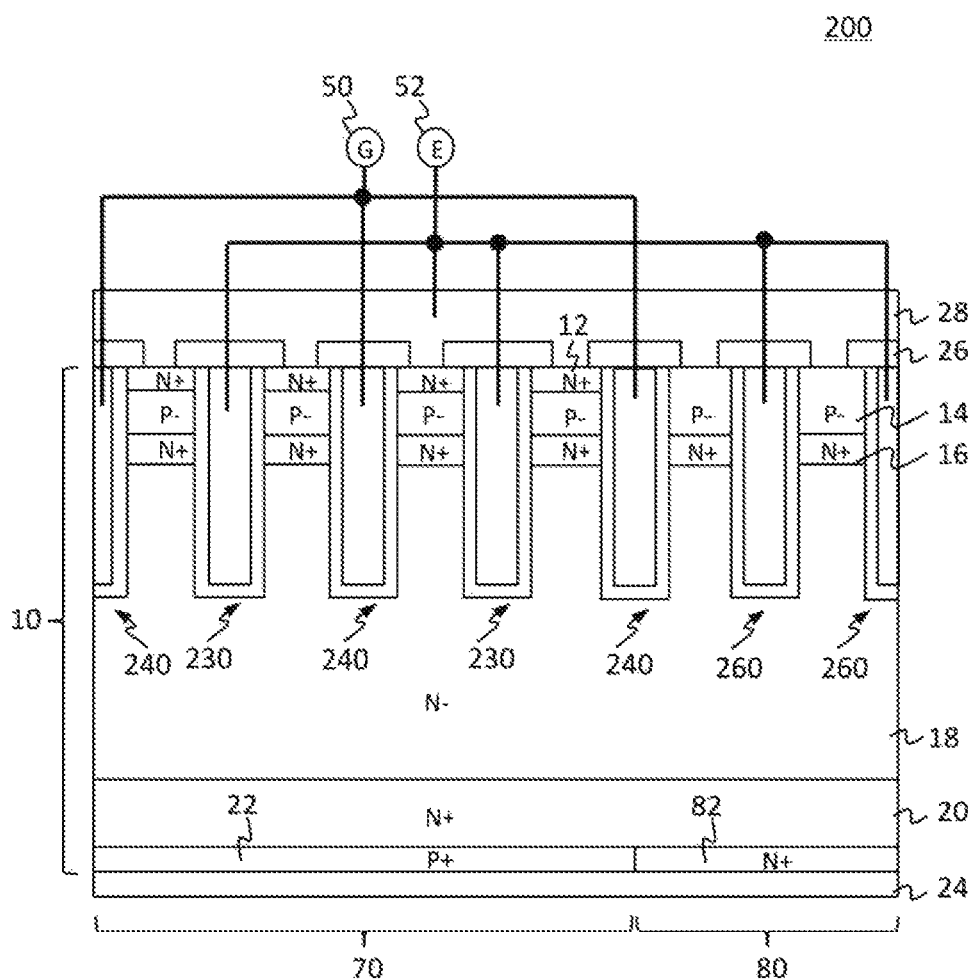
FIG. 10 shows an exemplary structure of a semiconductor device 200 relating to a second comparative example.

FIG. 10 shows an exemplary structure of a semiconductor device 200 relating to a second comparative example. The semiconductor device 200 relating to the second comparative example is different from the semiconductor device 200 shown in FIG. 9 in that the trenches are longer. In the semiconductor device 200 relating to the second comparative example, the gate trench 240, the dummy trench 230 and the emitter trench 260 have the same length as the dummy trench 30 as the semiconductor device 100 shown in FIG. 7 or 8. The semiconductor device 200 relating to the second comparative example can achieve good IE effects since the trenches are deep, which results in a low on-voltage. However, the collector-gate capacitance increases since the distance between the gate trench 240 and the collector electrode 24 is shortened.

Figure 11:
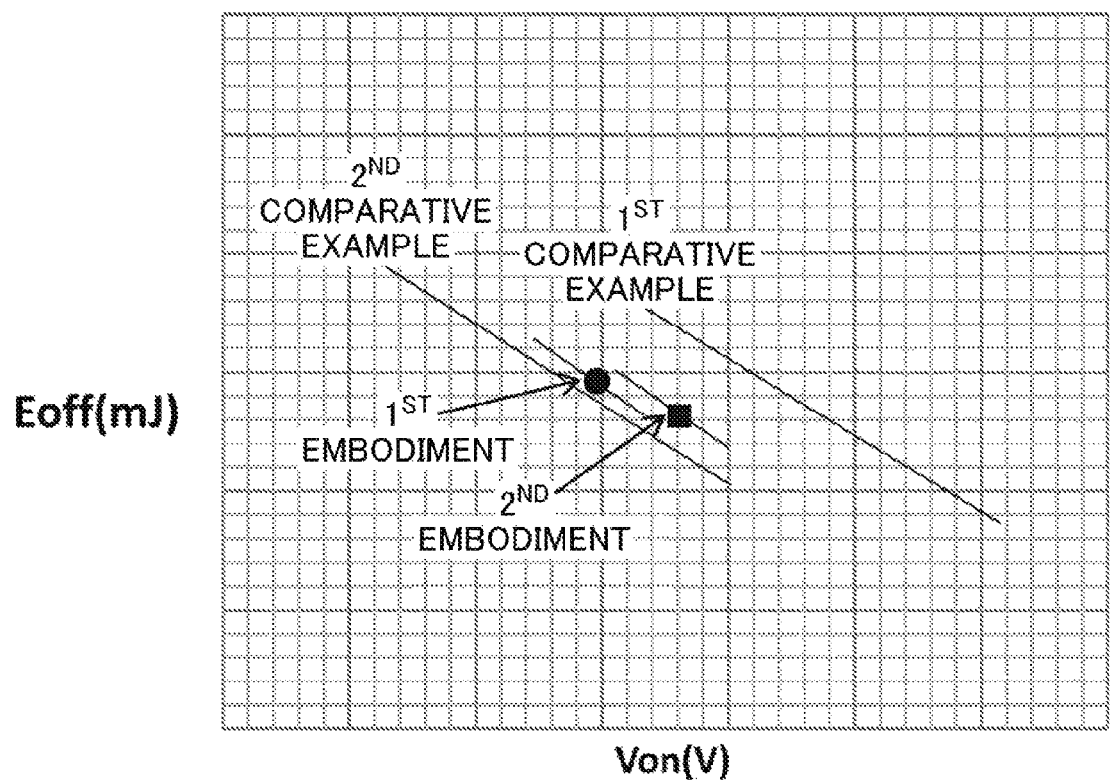
FIG. 11 shows the relation between the on-voltage Von and the turn-off loss Eoff for the first and second embodiments and the first and second comparative examples.

FIG. 11 shows the relation between the on-voltage Von and the turn-off loss Eoff for the first and second embodiments and the first and second comparative examples. Comparing the first comparative example against the second comparative example reveals that the second comparative example providing the deeper trenches achieves significantly improved Von-Eoff characteristics. In addition, FIG. 11 shows that the Von-Eoff characteristics achieved by the first and second embodiments having the deeper dummy trenches 30 are also improved to a similar degree to the Von-Eoff characteristics achieved by the second comparative example.

Figure 12:
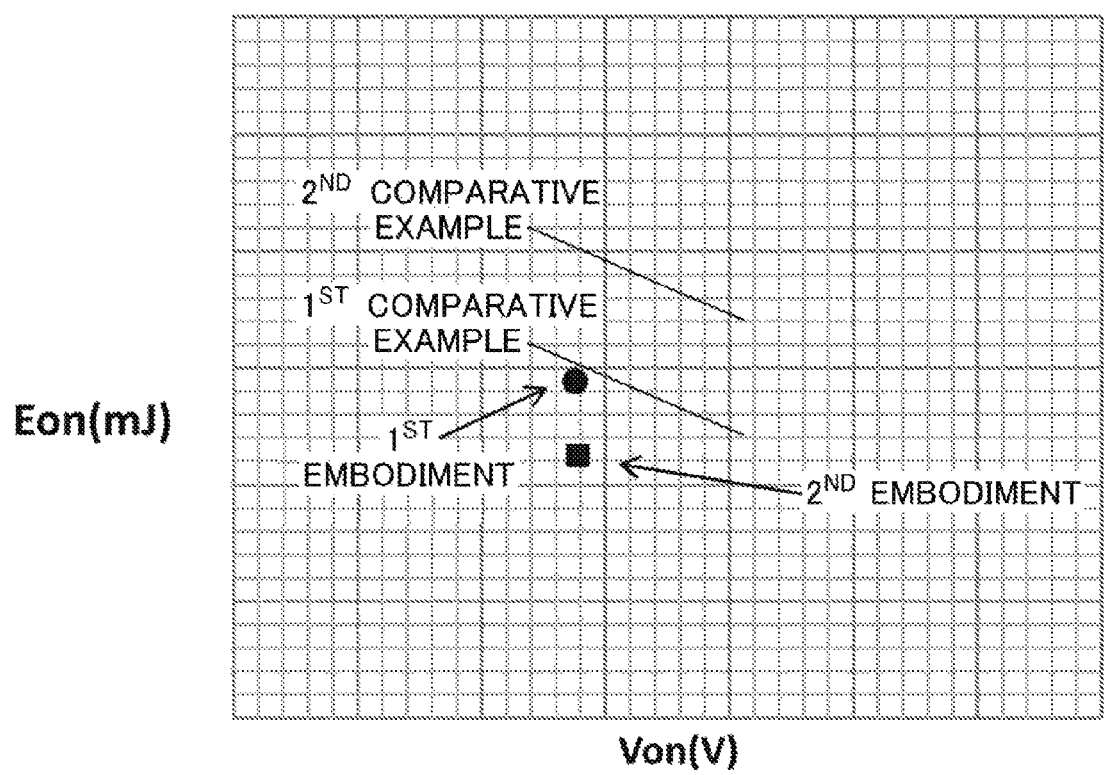
FIG. 12 shows the relation between the on-voltage Von and the turn-on loss Eon for the first and second embodiments and the first and second comparative examples.

FIG. 12 shows the relation between the on-voltage Von and the turn-on loss Eon for the first and second embodiments and the first and second comparative examples. Comparing the first comparative example against the second comparative example indicates that the turn-on loss Eon is significantly higher in the second comparative example since the collector-gate capacitance increases due to a shorter distance between the gate trench 240 and the collector electrode 24.

On the other hand, the turn-on loss Eon is not any higher in the first embodiment since the gate trench 40 is not deep and the collector-gate capacitance thus does not increase. In the second embodiment, the gate trench 40 is not deep and, additionally, the accumulation region 16 is positioned closer to the collector electrode than the bottom of the gate trench 40 is. Thus, the second embodiment is additionally less influenced by a transient collector-gate capacitance and thus achieves significantly improved Von-Eon characteristics.

Stated differently, the first embodiment can avoid degradation of the Von-Eon characteristics while improving the Von-Eoff characteristics when compared with the first comparative example. The second embodiment can achieve improved Von-Eoff characteristics when compared with the first comparative example, and also achieve improved Von-Eon characteristics.

Figure 13:
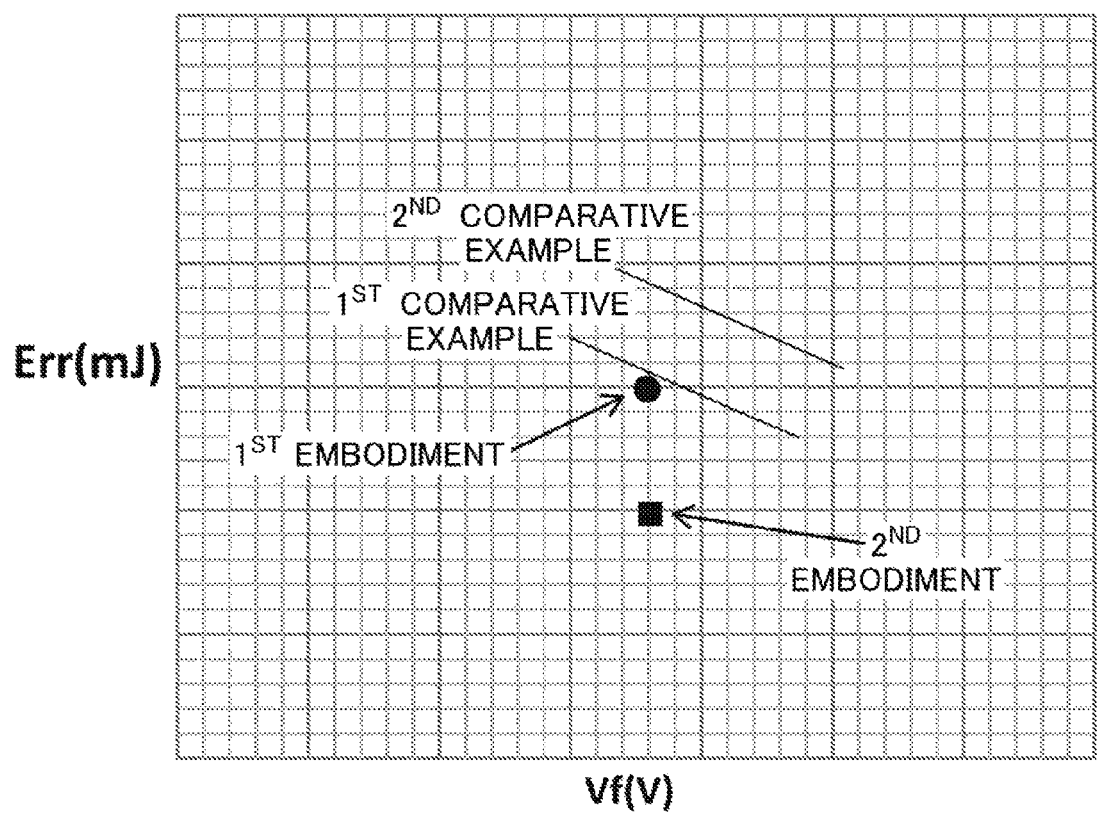
FIG. 13 shows the relation between the forward voltage Vf and the reverse recovery loss Err for the first and second embodiments and the first and second comparative examples.

FIG. 13 shows the relation between the forward voltage Vf and the reverse recovery loss Err for the first and second embodiments and the first and second comparative examples. Comparing the first comparative example against the second comparative example reveals that the reverse recovery loss Err is significantly higher in the second comparative example, where the distance between the gate trench 240 and the collector electrode 24 is short. The increase in the collector-gate capacitance results in a larger value for the parameter di/dt at the time when the semiconductor device is turned on. This increases the value of the parameter di/dt during the reverse recovery, thereby increasing the peak current Irp during the reverse recovery. As a consequence, the reverse recovery loss increases.

Here, the gate trench 40 is not deep in the first embodiment. Therefore, the collector-gate capacitance does not increase and the reverse recovery loss Err thus does not increase. In the second embodiment, the gate trench 40 is not deep and, additionally, the accumulation region 16 is positioned closer to the collector electrode than the bottom of the gate trench 40 is. Accordingly, the second embodiment is additionally less influenced by the transient collector-gate capacitance and thus achieves significantly improved Vf-Err characteristics.

Stated differently, the first embodiment can avoid degradation of the Vf-Err characteristics while improving the Von-Eoff characteristics when compared with the first comparative example. The second embodiment can achieve improved Von-Eoff characteristics when compared with the first comparative example, and also achieve improved Vf-Err characteristics. In addition, the second embodiment also achieves improved Von-Eon characteristics as shown in FIG. 12.

Figure 14:
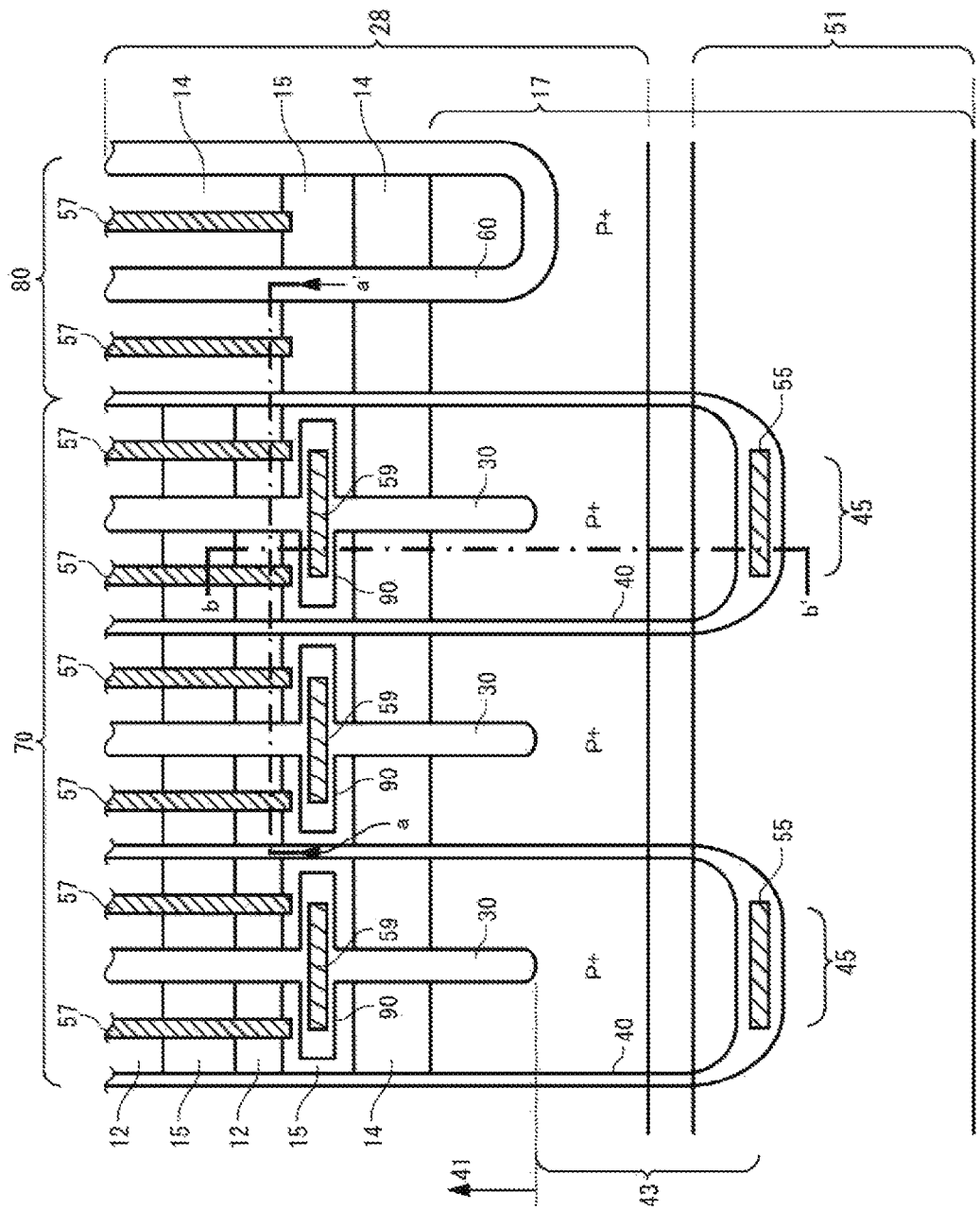
FIG. 14 shows an exemplary structure of a semiconductor device 100 relating to a seventh embodiment.

FIG. 14 shows an exemplary structure of a semiconductor device 100 relating to a seventh embodiment. FIG. 14 only shows the surface of a chip in the vicinity of the edge of the chip, and does not show the remaining region. FIG. 14 shows the active region of the semiconductor substrate of the semiconductor device 100, but the semiconductor device 100 may include an edge termination structure surrounding the active region. The active region denotes the region through which currents flow when the semiconductor device 100 is turned on. The edge termination structure is configured to reduce concentration of electrical fields in the semiconductor substrate 10 on the front surface side thereof. The edge termination structure includes, for example, guard rings, field plates, RESURFs (reduced surface fields) and combinations thereof.

In the semiconductor device 100 relating to the seventh embodiment, the gate electrode 51, the emitter electrode 28, the gate trench 40, the dummy trench 30, the emitter trench 60, a well region 17, the emitter region 12, the base region 14, the contact region 15, a contact hole 55, a contact hole 57 and a contact hole 59 are provided on the front surface of the chip.

While the gate trench 40, the dummy trench 30, the emitter trench 60, the well region 17, the emitter region 12, the base region 14 and the contact region 15 are formed in the semiconductor substrate 10 on the front surface side thereof, the emitter electrode 28 and the gate electrode 51 are formed on the front surface of the semiconductor substrate 10.

FIG. 14 does not show the insulative layer 26, which is formed between the front surface of the semiconductor substrate and the emitter and gate electrodes 28 and 51. The contact holes 55, 57 and 59 penetrate through this inter-layer insulative film. The emitter electrode 28 is in contact with the semiconductor substrate 10 through the contact hole 57. The gate electrode 51 is in contact with the semiconductor substrate 10 through the contact hole 55.

The emitter electrode 28 and the gate electrode 51 are made of a metal-containing material. For example, the electrodes are at least partially made of aluminum or aluminum-silicon alloy. The electrodes may include a barrier metal made of titanium or a titanium compound as their underlying layer or have a region formed by a material including tungsten plugs between the aluminum region and the barrier metal.

One or more gate trenches 40 and one or more dummy trenches 30 are arranged at predetermined intervals along a predetermined arrangement direction in the transistor portion 70. The dummy trenches 30 extend in a predetermined extending direction along the front surface of the semiconductor substrate 10. In the seventh embodiment, the dummy trenches 30 are shaped like straight lines and extend in a direction perpendicular to the above-mentioned arrangement direction.

Each gate trench 40 has an opposing portion 41 and a protruding portion 43. The opposing portion 41 opposes the dummy trench 30 and extends in the above-mentioned extending direction. In other words, the opposing portion 41 is parallel to the dummy trench 30. The protruding portion 43 extends further from the opposing portion 41 and does not oppose the dummy trench 30. In the present example, two opposing portions 41 sandwiching each dummy trench 30 are connected to each other via one protruding portion 43. The protruding portion 43 may be at least partially curved. The opening width of the dummy trench 30 may be larger than the opening width of the gate trench 40.

The contact hole 55 is formed in the insulative layer covering the protruding portion 43. The contact hole 55 may be formed in the region corresponding to the protruding portion 43 so as to be most distant from the opposing portion 41. In the protruding portion 43 relating to the present example, the most distant region from the opposing portion 41 has a portion extending in a direction perpendicular to the opposing portion 41. The contact hole 55 may be formed in this portion of the protruding portion 43.

This portion of the protruding portion 43 may be referred to as a connecting portion 45 that is designed to allow the protruding portion 43 to connect two opposing portions 41 together. The connecting portion 45 may indicate a partial region of the protruding portion 43 which extends in a direction perpendicular to the opposing portion 41 and which has the maximum trench opening width. The contact hole 55 may be at least partially formed in the connecting portion 45. The opening width of the connecting portion 45 of the gate trench 40 may be larger than that of the opposing portion 41. In the present example, the trench opening width of the connecting portion 45 means the width of the connecting portion 45 in the extending direction of the opposing portion 41. The trench opening width of the opposing portion 41 means the width of the opposing portion 41 in the direction perpendicular to the extending direction of the opposing portion 41. The opening width of the connecting portion 45 of the gate trench 40 may be the same as the opening width of the dummy trench 30.

The emitter trench 60 is provided in the diode portion 80. The emitter trench 60 may be shaped in the same manner as the gate trench 40. It should be noted that the length of the emitter trench 60 in the extending direction may be shorter or longer than that of the gate trench 40.

The gate electrode 51 covers part of the protruding portion 43. The gate electrode 51 covers the portion of the protruding portion 43 in which the contact hole 55 is formed. In the present example, the gate electrode 51 is formed so as not to cover the opposing portion 41, the dummy trench 30 and the emitter trench 60.

The emitter electrode 28 is formed to cover the gate trench 40, the dummy trench 30, the emitter trench 60, the well region 17, the emitter region 12, the base region 14 and the contact region 15. In the present example, the emitter electrode 28 covers part of the well region 17 and part of the gate trench 40.

The well region 17 covers a predetermined range from one of the edges of the semiconductor substrate 10 at which the gate electrode 51 is provided. The well region 17 is positioned closer to the edge of the semiconductor substrate 10 than the base region 14 is. The diffusion depth of the well region 17 may be larger than the depths of the gate trench 40, the dummy trench 30 and the emitter trench 60. The partial regions positioned closer to the gate electrode 51 of the dummy trench 30, the emitter trench 60 and the opposing portion 41 are formed in the well region 17. The bottom of the end, in the extending direction, of the dummy trench 30 may be covered with the well region 17. The protruding portion 43 may be entirely formed in the well region 17.

The base region 14 is formed in the regions sandwiched between the trenches. The base region 14 is of the second conductivity type and has a lower impurity concentration than the well region 17. In the present example, the base region 14 is of the P⁻-type.

On the front surface of the base region 14, the contact region 15 of the second conductivity type which has a higher impurity concentration than the base region 14 is formed. In the present example, the contact region 15 is of the P⁺-type. In the transistor portion 70, the emitter region 12 of the first conductivity type which has a higher impurity concentration than the semiconductor substrate 10 is selectively formed on part of the front surface of the contact region 15. In the present example, the emitter region 12 is of the N⁺-type.

The contact region 15 and the emitter region 12 each extend from one of adjacent trenches to the other. In the transistor portion 70, one or more contact regions 15 and one or more emitter regions 12 are alternately externally exposed at the front surface of the semiconductor substrate 10, in the regions sandwiched between the trenches, along the extending direction of the trenches.

In the transistor portion 70, the contact hole 57 is formed above the contact region 15 and the emitter region 12. The contact hole 57 allows the contact region 15 and the emitter region 12 to be at least partially externally exposed. The contact hole 57 is not formed in the region corresponding to the base region 14 and the well region 17

In the diode portion 80, the contact hole 57 is formed above the contact region 15 and the base region 14. The contact hole 57 in the diode portion 80 allows the contact region 15 and the base region 14 to be at least partially externally exposed. In the present example, the contact hole 57 is not formed above one of the base regions 14 that is the closest to the gate electrode 51. In the present example, the contact hole 57 in the transistor portion 70 has the same length as the contact hole 57 in the diode portion 80 in the extending direction of the trenches.

In the present example, the dummy trench 30 has a branch portion 90. The branch portion 90 protrudes towards the gate trench 40 from a portion of the dummy trench 30 that extends parallel to the gate trench 40. In the present example, the branch portion 90 extends in a direction parallel to the edge of the well region 17 at the front surface of the semiconductor substrate 10. The branch portion 90 has the same depth as the remaining portion of the dummy trench 30. The branch portion 90 may be deeper than the remaining portion of the dummy trench 30.

The addition of the branch portion 90 to the dummy trench 30 can help prevent the holes in the active region from flowing out into the well region 17. This can result in a lowered on-voltage.

The branch portion 90 may be formed in the contact region 15 that is the closest to the well region 17 from among a plurality of contact regions 15 that alternate with a plurality of emitter regions 12. In other words, the branch portion 90 may be positioned the most outside in the active region . This can contribute to efficiently prevent the holes in the active region from flowing out into the well region 17.

Here, the branch portions 90 of the respective dummy trenches 30 are preferably aligned on the same straight line. In this manner, a wall-like trench can be formed that separates the active region and the well region 17 from each other. Here, it should be noted that the branch portions 90 are not in contact with the adjacent gate trenches 40. In other words, the branch portions 90 are spaced away from each other along the same straight line.

Figure 15:
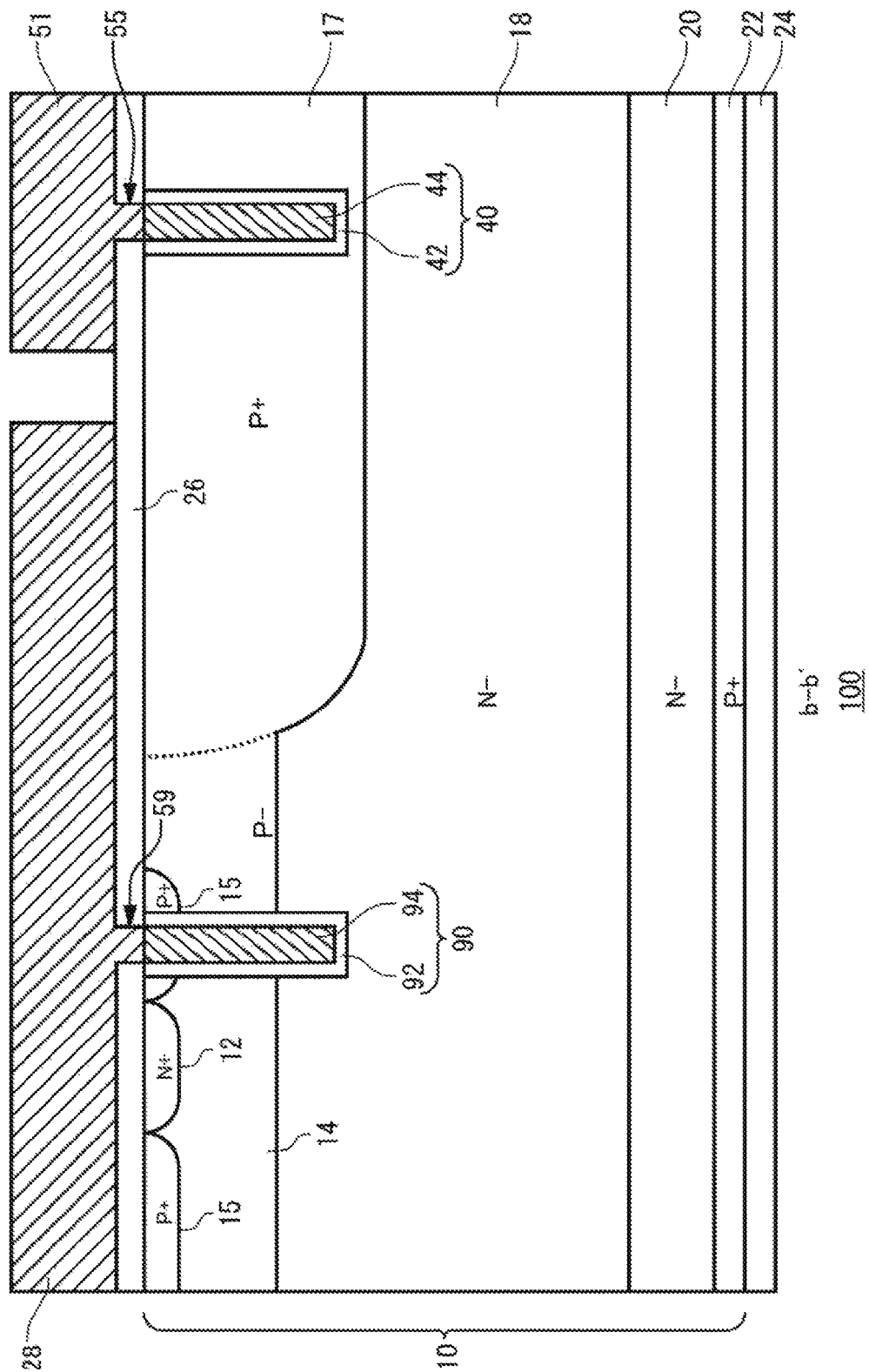
FIG. 15 is a cross-sectional view showing the semiconductor device 100 relating to the seventh embodiment along b-b' in FIG. 14.

FIG. 15 is a cross-sectional view showing the semiconductor device 100 relating to the seventh embodiment along b-b' in FIG. 14. The branch portion 90 of the dummy trench 30 penetrates through the contact region 15 and the base region 14. The branch portion 90 may penetrate through the base region 14 between the contact region 15 and the well region 17. The branch portion 90 may have the same depth as the gate trench 40 formed below the contact hole 55 or extend deeper than the gate trench 40. The branch portion 90 has an insulating film 92 formed on the inner wall of the groove and an electrically conductive portion 94 enclosed within the insulating film 92 in the groove.

The branch portion 90 may have the same depth as the well region 17 or a larger depth than the well region 17. In the latter case, the gate trench 40, which is formed below the contact hole 55, may also have a larger depth than the well region 17. By forming the branch portion 90 penetrating through the base region 14, a smooth electrical field distribution is formed at the boundary between the well region 17 and the base region 14. This can prevent the holes injected into the drift layer 18 from the back surface of the semiconductor substrate 10 in the active region from flowing out into the well region 17.

Figure 16:
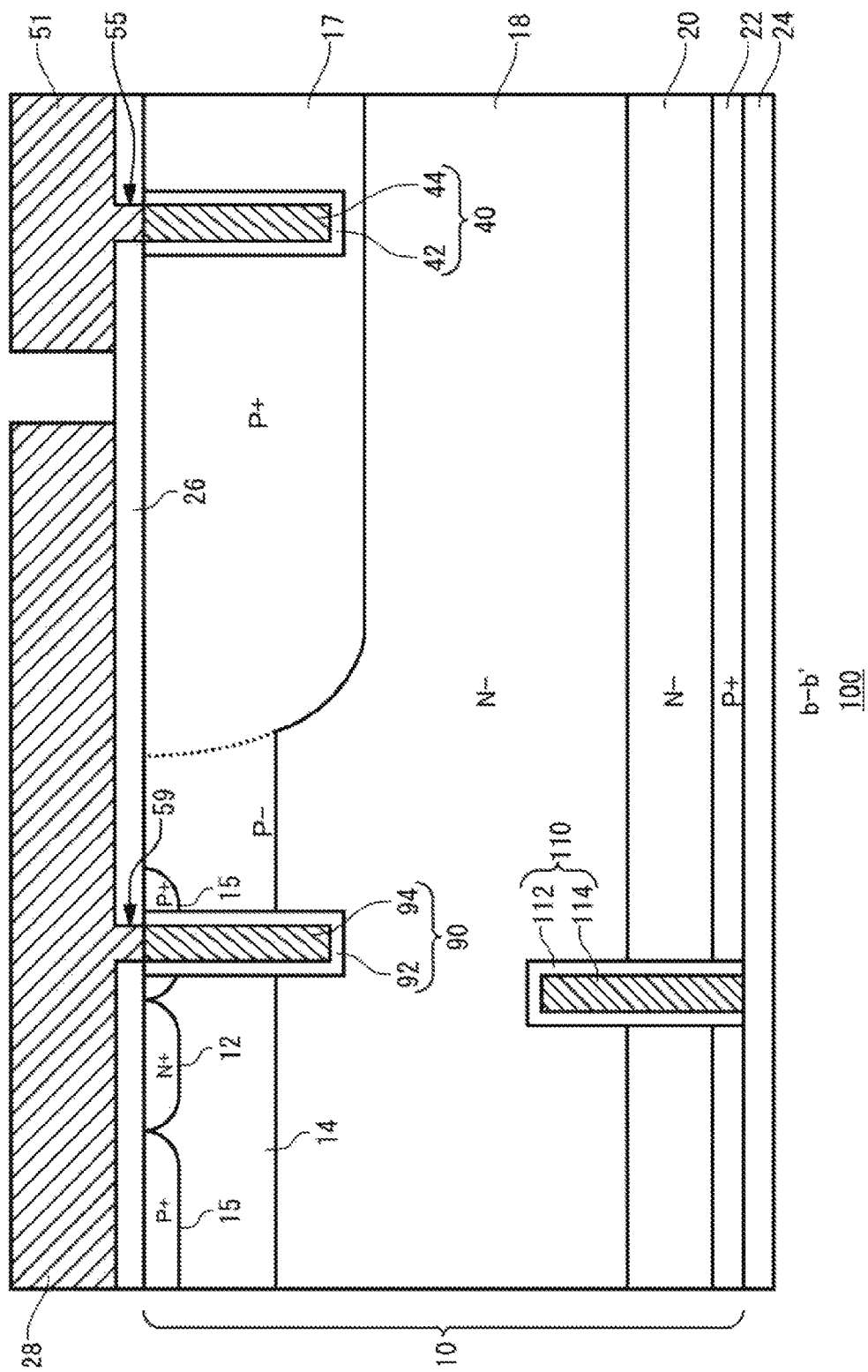
FIG. 16 shows an exemplary structure of a semiconductor device 100 relating to an eighth embodiment.

FIG. 16 shows an exemplary structure of a semiconductor device 100 relating to an eighth embodiment. The semiconductor device 100 relating to the eighth embodiment further includes a back-surface trench 110 formed in the semiconductor substrate 10 on the back surface side thereof, in addition to the components of the semiconductor device 100 relating to the seventh embodiment. The back-surface trench 110 includes an insulating film 112 formed on the inner wall of the groove and an electrically conductive portion 114 enclosed in the insulating film 112 within the groove. In the present example, the back-surface trench 110 extends from the back surface of the semiconductor substrate 10 to reach the drift layer 18.

In the depth direction, the back-surface trench 110 may be longer than the dummy trench 30. For example, the depth of the dummy trench 30 is equal to or less than 10 µm and the depth of the back-surface trench 110 is equal to or more than 100 µm. Here, it should be noted that the sum of the depths of the back-surface trench 110 and the dummy trench 30 is smaller than the thickness of the semiconductor substrate 10. Stated differently, the bottom of the back-surface trench 110 is spaced away in the depth direction from the bottom of the dummy trench 30. The drift layer 18 may be formed between the bottom of the back-surface trench 110 and the bottom of the dummy trench 30 in the depth direction. The existence of the back-surface trench 110 can also contribute to prevent the holes from flowing out of the active region into the well region 17.

The back-surface trench 110 is preferably positioned so as not to oppose the branch portion 90 of the dummy trench 30. In this way, the strength of the semiconductor substrate 10 can be maintained. The back-surface trench 110 may be positioned closer to the center of the semiconductor substrate 10 than the branch portion 90 of the dummy trench 30 is. Such positioning only allows a narrow path to be formed for the holes flowing from the active region to the well region 17. Alternatively, the back-surface trench 110 may be positioned closer to the edge of the semiconductor substrate 10 than the branch portion 90 of the dummy trench 30 is.

Figure 17:
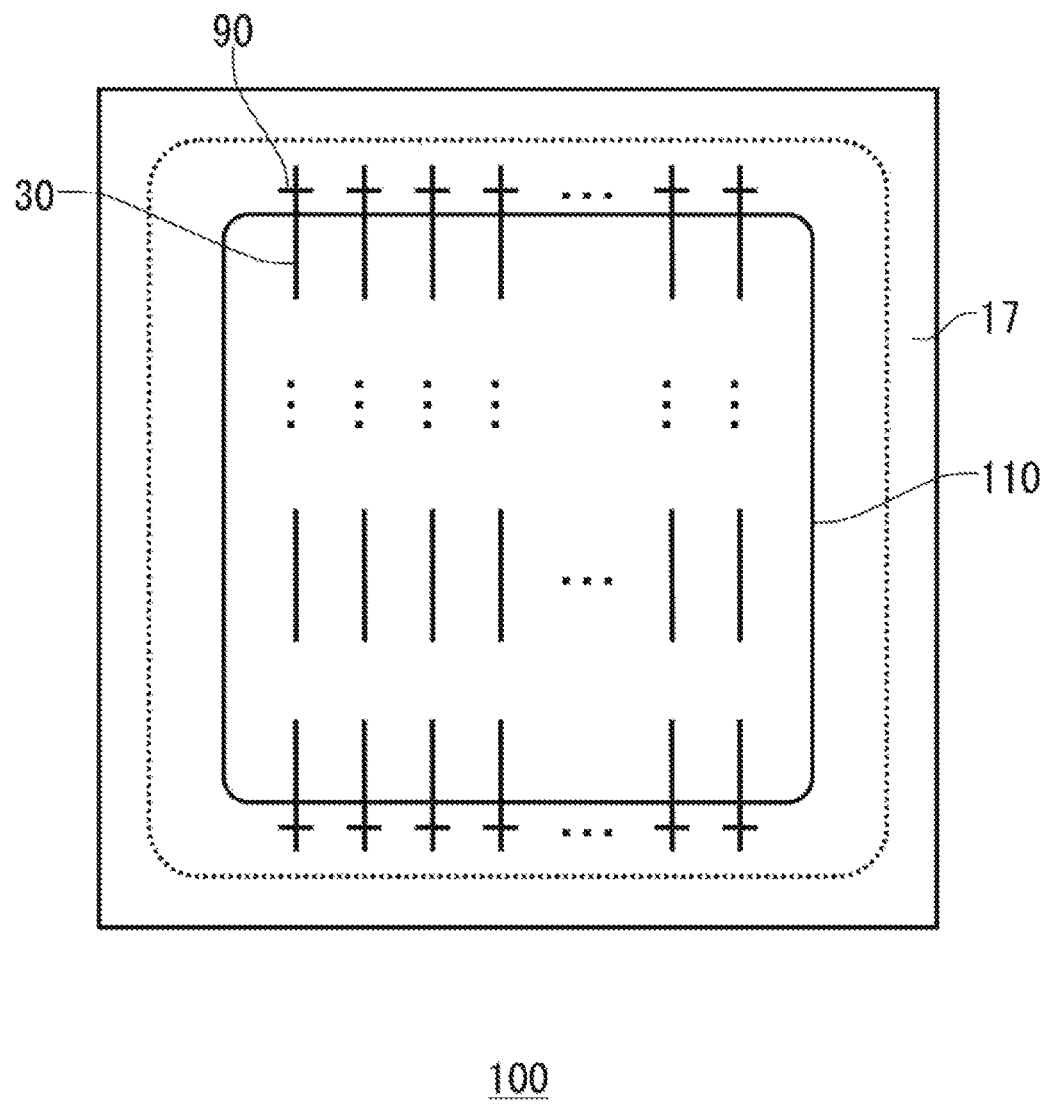
FIG. 17 shows an exemplary arrangement of a back-surface trench 110 and a branch portion 90 of a dummy trench 30.

FIG. 17 shows an exemplary arrangement of the back-surface trench 110 and the branch portion 90 of the dummy trench 30. FIG. 17 is a schematic view showing the back surface of the semiconductor device 100. FIG. 17 only presents the dummy trench 30, the back-surface trench 110 and the well region 17 and does not show the other components such as the gate trench 40. The dummy trench 30 is actually formed in the semiconductor substrate 10 on the front surface side thereof, but FIG. 17 shows the projective position of the dummy trench 30 on the back surface of the semiconductor substrate 10.

In the present example, the back-surface trench 110 is annularly formed at the back surface of the semiconductor substrate 10. In the region enclosed by the back-surface trench 110, the dummy trench 30, the gate trench 40, the emitter trench 60 and the like are formed. However, the dummy trench 30 and the gate trench 40 partially protrude out into the region outside the back-surface trench 110. Specifically speaking, the branch portion 90 of the dummy trench 30 is formed outside the back-surface trench 110. Outside the back-surface trench 110, the branch portions 90 are aligned with each other along the same straight line and spaced away from each other. This configuration can help prevent the holes from flowing out of the active region enclosed by the back-surface trench 110 into the well region 17.

Figure 18:
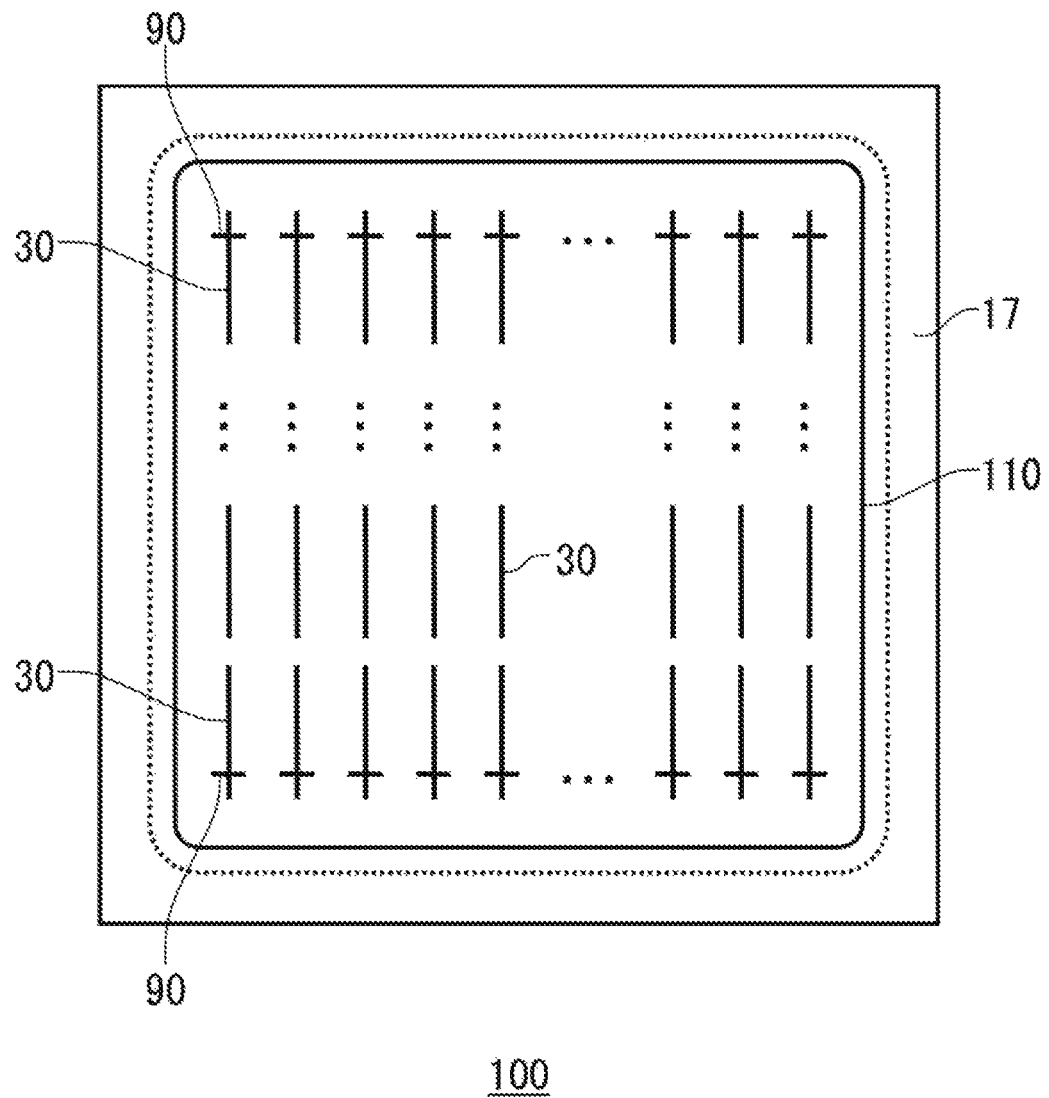
FIG. 18 shows another exemplary arrangement of the back-surface trench 110 and the branch portion 90 of the dummy trench 30.

FIG. 18 shows another exemplary arrangement of the back-surface trench 110 and the branch portion 90 of the dummy trench 30. In the present example, the back-surface trench 110 is annularly formed in the semiconductor substrate 10 on the back surface side thereof. In the region enclosed by the back-surface trench 110, the dummy trench 30, the gate trench 40, the emitter trench 60 and the like are formed. In the present example, the dummy trench 30 is entirely positioned within the region enclosed by the back-surface trench 110.

In the region enclosed by the back-surface trench 110, the branch portions 90 are aligned with each other along the same straight line and spaced away from each other. This configuration can also help prevent the holes from flowing out of the active region enclosed by the back-surface trench 110 into the well region 17. According to the present example, the back-surface trench 110 does not intersect with the dummy trench 30, which can contribute to maintain the strength of the semiconductor substrate 10.

Figure 19:
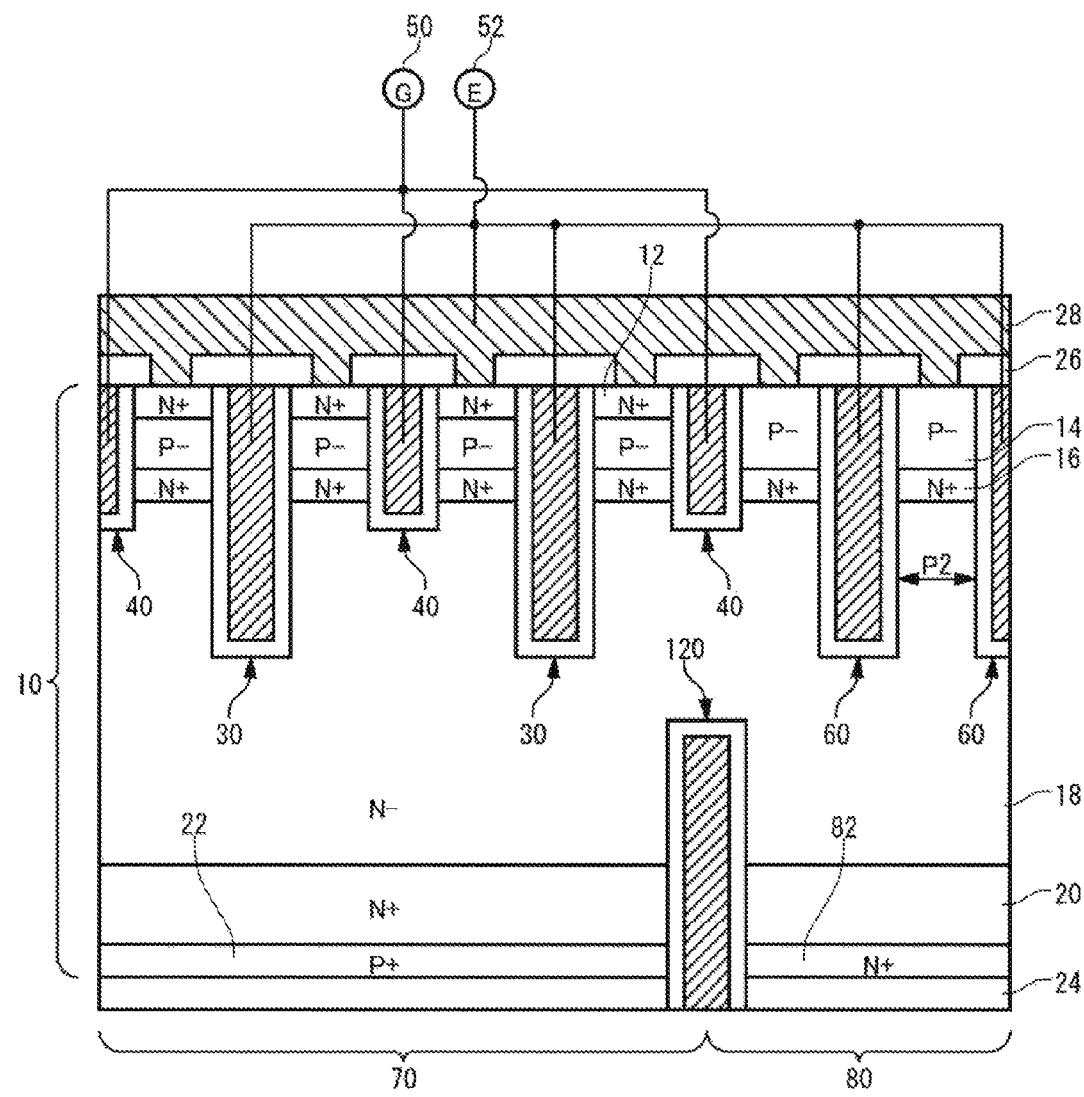
FIG. 19 is a cross-sectional view showing an exemplary structure of a semiconductor device 100 relating to a ninth embodiment.

FIG. 19 is a cross-sectional view showing an exemplary structure of a semiconductor device 100 relating to a ninth embodiment. The semiconductor device 100 relating to the ninth embodiment further includes a back-surface trench 120 in addition to the components of the semiconductor device 100 relating to the fifth embodiment shown in FIG. 7. The back-surface trench 120 may be configured and sized in the same manner as the back-surface trench 110.

The back-surface trench 120 is positioned at the boundary between the transistor portion 70 and the diode portion 80. This configuration can prevent the holes from flowing between the transistor portion 70 and the diode portion 80. In addition to the back-surface trench 120 shown in FIG. 19, the back-surface trench 110 shown in FIG. 16 may be further provided.

The back-surface trench 120 is preferably positioned so as not to oppose the dummy trench 30. In the present example, the back-surface trench 120 is positioned so as to oppose one of the gate trenches 40 that is the closest to the diode portion 80. The back-surface trench 120 may be annularly formed so as to enclose the transistor portion 70 therein. This configuration can help maintain the strength of the semiconductor substrate 10 while dividing the transistor portion 70 and the diode portion 80 from each other.

Figure 20:
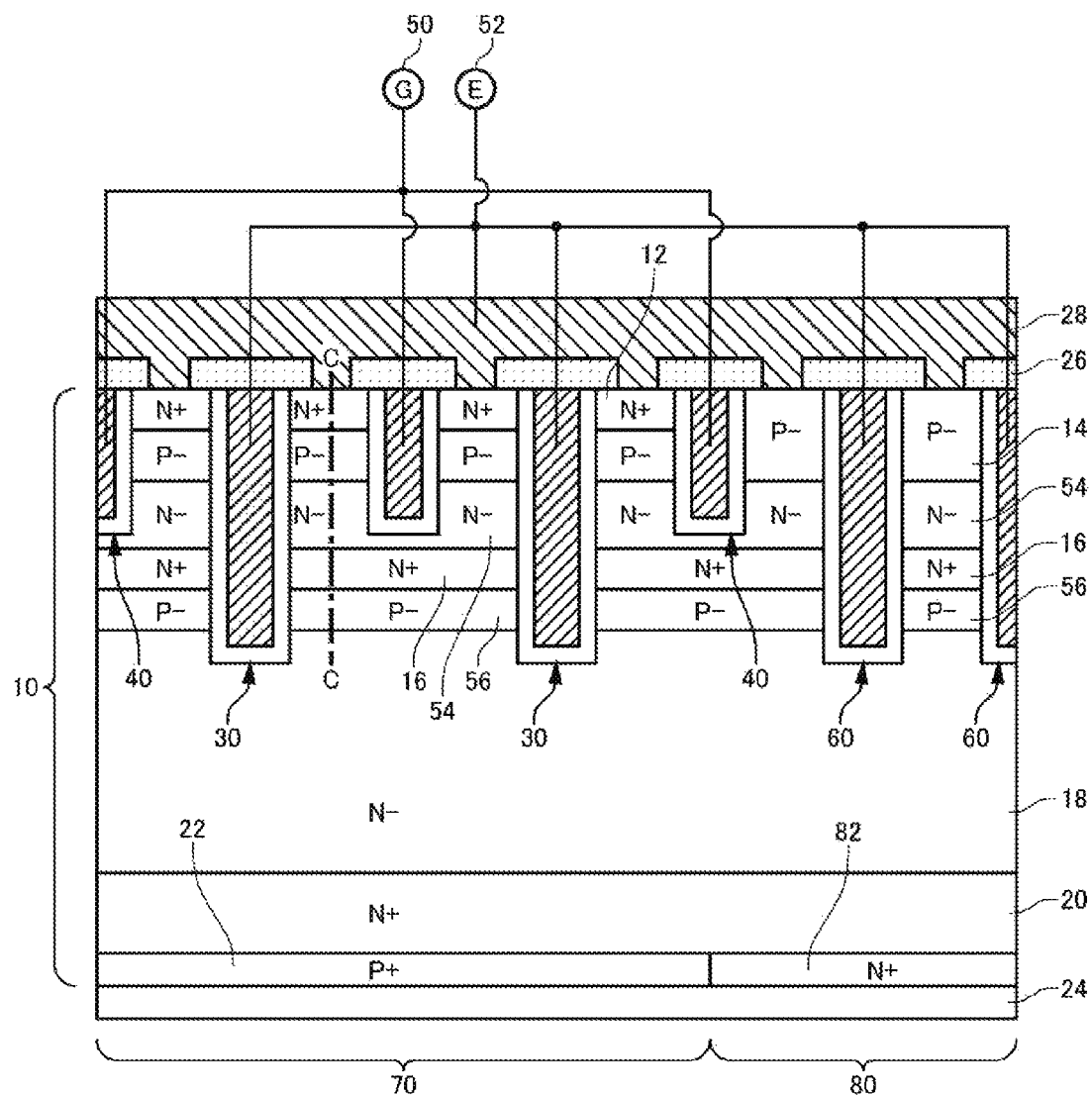
FIG. 20 is a cross-sectional view showing an exemplary structure of a semiconductor device 100 relating to a tenth embodiment.

FIG. 20 is a cross-sectional view showing an exemplary structure of a semiconductor device 100 relating to a tenth embodiment. The semiconductor device 100 relating to the present example includes a transistor portion 70 and a diode portion 80, as in the fifth embodiment shown in FIG. 7. The transistor portion 70 relating to the present example further includes a floating region 56 in addition to the components of the second embodiment shown in FIG. 3. The diode portion 80 relating to the present example further includes a low-concentration region 54 and a floating region 56 in addition to the components of the diode portion 80 shown in FIG. 7.

The low-concentration region 54 in the diode portion 80 is positioned between the base region 14 and the accumulation region 16. The low-concentration region 54 in the diode portion 80 is formed at the same depth and has the same impurity concentration as the low-concentration region 54 in the transistor portion 70.

In the transistor portion 70 and the diode portion 80, the floating region 56 is formed to face the back surface of the accumulation region 16. In the present example, the floating region 56 is disposed between the accumulation region 16 and the drift layer 18. The floating region 56 is of the P⁻-type. The floating region 56 is not electrically connected to the emitter electrode 28. In addition, the floating region 56 is not electrically connected to the base region 14 either. In the present example, the N⁻-type low-concentration region 54 and the N⁺-type accumulation region 16 are disposed between the floating region 56 and the base region 14.

The existence of the accumulation region 16 can help increase the IE effects and reduce the on-voltage. On the other hand, the provision of the accumulation region 16 between the dummy trenches 30 may lower the breakdown voltage. To address this issue, the P-type floating region 56 is provided below the accumulation region 16, which can prevent the breakdown voltage from dropping.

Figure 21:
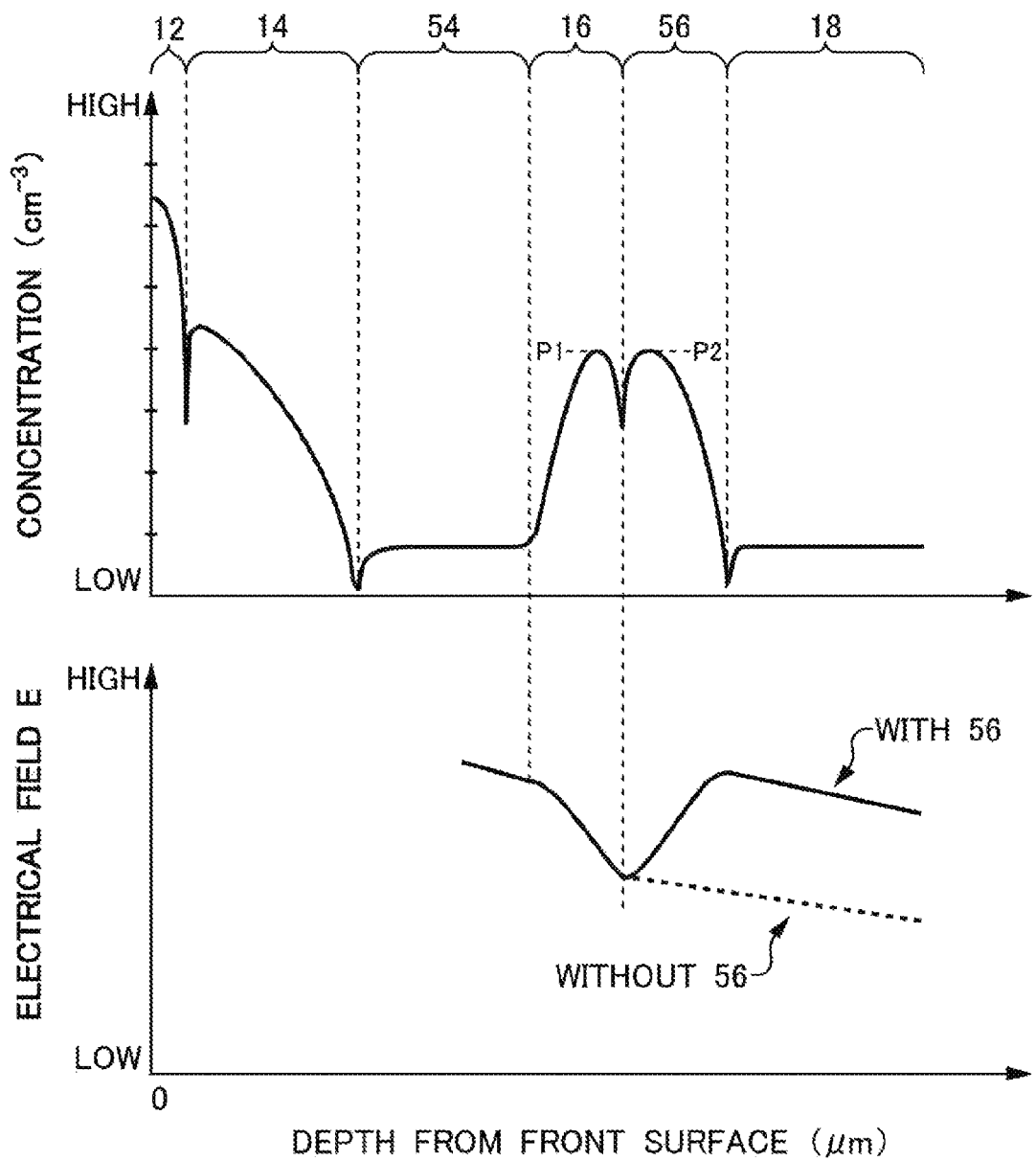
FIG. 21 shows an exemplary impurity concentration distribution and an exemplary electrical field intensity distribution along the cross-section cut along the line C-C indicated in FIG. 20.

FIG. 21 shows an exemplary impurity concentration distribution and an exemplary electrical field intensity distribution along the cross-section cut along the line C-C indicated in FIG. 20. The lower graph in FIG. 21 uses the solid line to show the electrical field intensity distribution observed when the floating region 56 is provided and uses the dotted line to show the electrical field intensity distribution observed when the floating region 56 is not provided.

As seen from FIG. 21, the existence of the accumulation region 16, which exhibits a high concentration, significantly lowers the electrical field intensity in the accumulation region 16 from the front surface side to the back surface side. This disadvantageously lowers the breakdown voltage unless the floating region 56 is provided. The existence of the floating region 56, which has the opposite conductivity type to the accumulation region 16, can raise the electrical field intensity, which has dropped in the accumulation region 16, from the front surface side to the back surface side. This can prevent the breakdown voltage of the semiconductor device 100 from degrading.

The impurity concentration P2 of the floating region 56 may be equal to or lower than the impurity concentration P1 of the accumulation region 16. Here, the impurity concentration comparison between any regions may be based on the peak values. Alternatively, the impurity concentration comparison between any regions may be based on the values of the impurity concentrations integrated in the depth direction. The impurity concentration P2 may be equal to the impurity concentration P1. The existence of such a floating region 56 can reduce the breakdown voltage drop.

Figure 22:
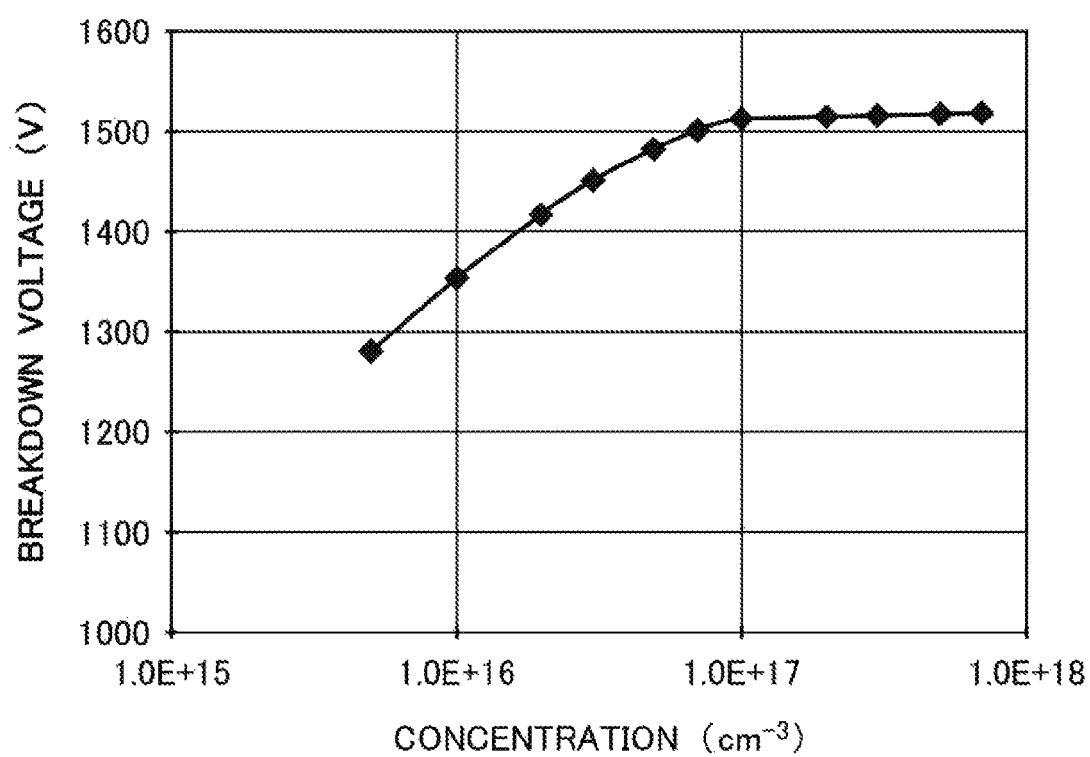
FIG. 22 shows how the peak value P2 of the impurity concentration in a floating region 56 is related to the breakdown voltage of the semiconductor device 100.

FIG. 22 shows how the peak value P2 of the impurity concentration in the floating region 56 is related to the breakdown voltage of the semiconductor device 100. In the present example, the peak value of the impurity concentration in the accumulation region 16 is $1.0 \times 10^{17}/cm^3$.

As seen from FIG. 22, as the impurity concentration P2 of the floating region 56 increases, the breakdown voltage of the semiconductor device 100 accordingly improves. However, it should be noted that, once the impurity concentration P2 of the floating region 56 exceeds the impurity concentration P1 of the accumulation region 16, the breakdown voltage varies rather slowly. For this reason, the impurity concentration P2 of the floating region 56 may be equal to or lower than the impurity concentration P1 of the accumulation region 16. For the purposes of reducing the breakdown voltage drop, however, the impurity concentration P2 of the floating region 56 is preferably equal to or higher than half the impurity concentration P1 of the accumulation region 16.

Here, the floating region 56 is preferably positioned closer in the depth direction to the base region 14 than the bottom of the dummy trench 30 is. In other words, the bottom of the dummy trench 30 is not covered with the floating region 56. This allows electrons to be injected into the drift layer 18 via the insulating film also through the bottom of the dummy trench 30.

Figure 23:
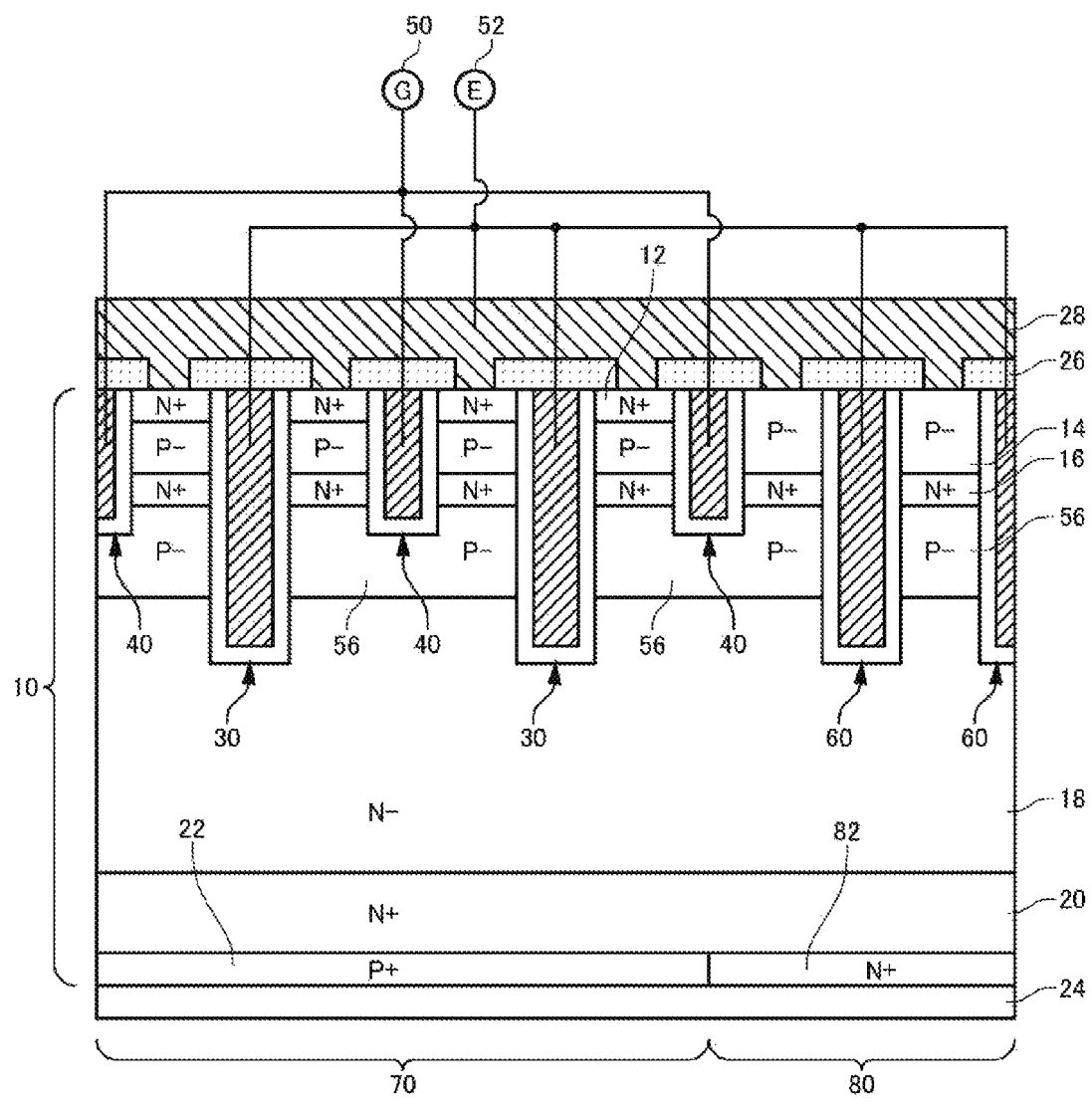
FIG. 23 is a cross-sectional view showing an exemplary structure of a semiconductor device 100 relating to an eleventh embodiment.

FIG. 23 is a cross-sectional view showing an exemplary structure of a semiconductor device 100 relating to an eleventh embodiment. The semiconductor device 100 relating to the present example further includes a floating region 56, which is formed to face the back surface of the accumulation region 16, in addition to the components of the fifth embodiment shown in FIG. 7. The floating region 56 is the same as the floating region 56 described with reference to FIGS. 20 to 22. The arrangement shown in FIG. 23 can also prevent the breakdown voltage drop due to the existence of the floating region 56, while still improving the IE effects, which can be achieved by the accumulation region 16.

Figure 24:
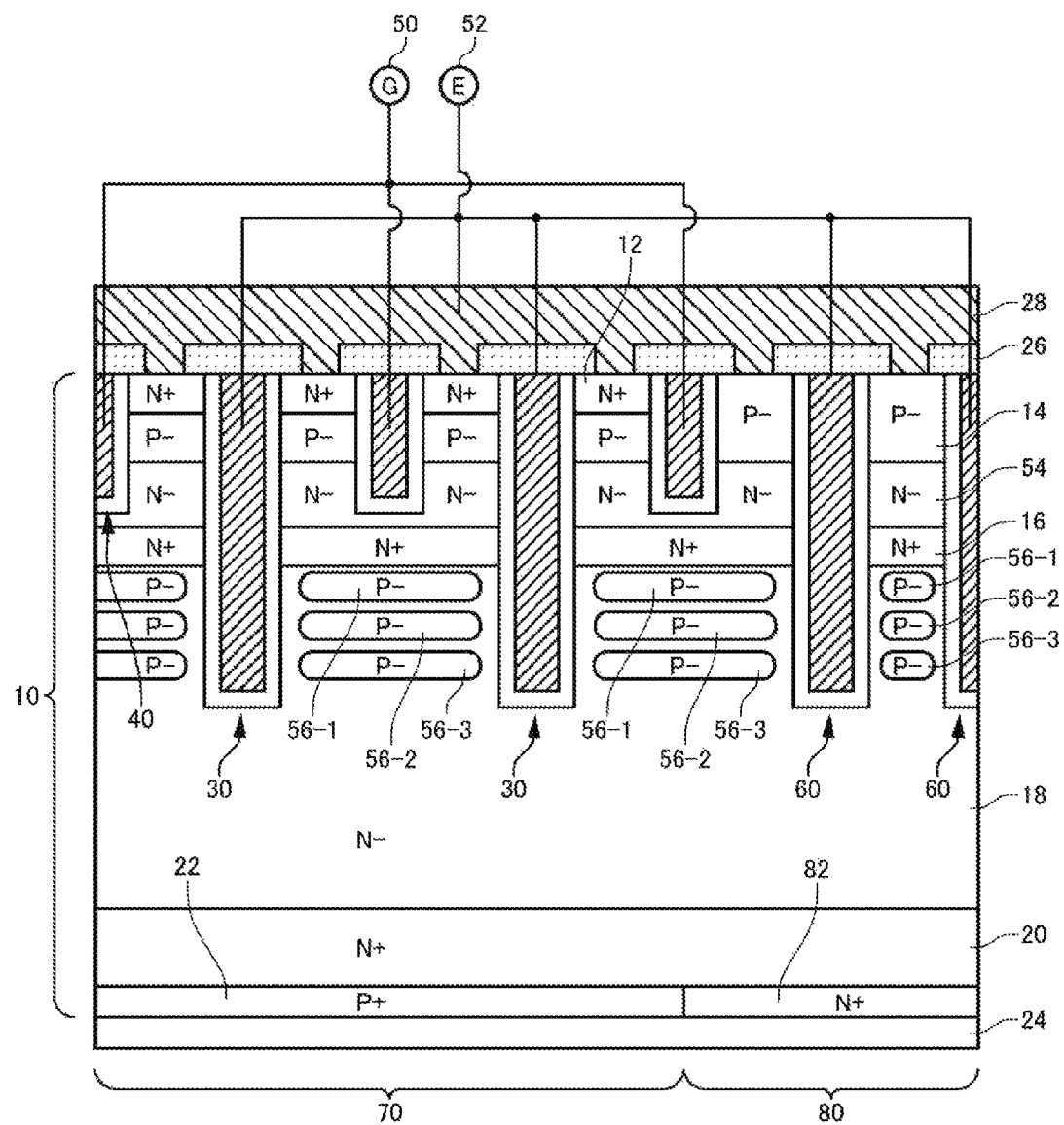
FIG. 24 is a cross-sectional view showing an exemplary structure of a semiconductor device 100 relating to a twelfth embodiment.

FIG. 24 is a cross-sectional view showing an exemplary structure of a semiconductor device 100 relating to a twelfth embodiment. In the semiconductor device 100 relating to the present example, the floating region 56 is differently arranged than in the tenth embodiment shown in FIG. 20. Except for such differences, the twelfth embodiment is the same as the tenth embodiment.

In the present example, a plurality of floating regions 56 are formed at different depths between the bottom of the dummy trench 30 or emitter trench 60 and the base region 14. Such floating regions 56 can be formed by injecting impurities such as protons through the front surface of the semiconductor substrate 10 at varying accelerating voltage levels.

The respective floating regions 56 may be in contact with or spaced away from the side wall of the dummy trench 30 or the emitter trench 60. The floating regions 56 may be arranged with N⁻-type regions placed therebetween, or the floating regions 56 may be combined with each other. When the floating regions 56 are combined with each other, the P-type regions are continuously arranged. Such arrangements can further reduce the breakdown voltage drop.

Figure 25:
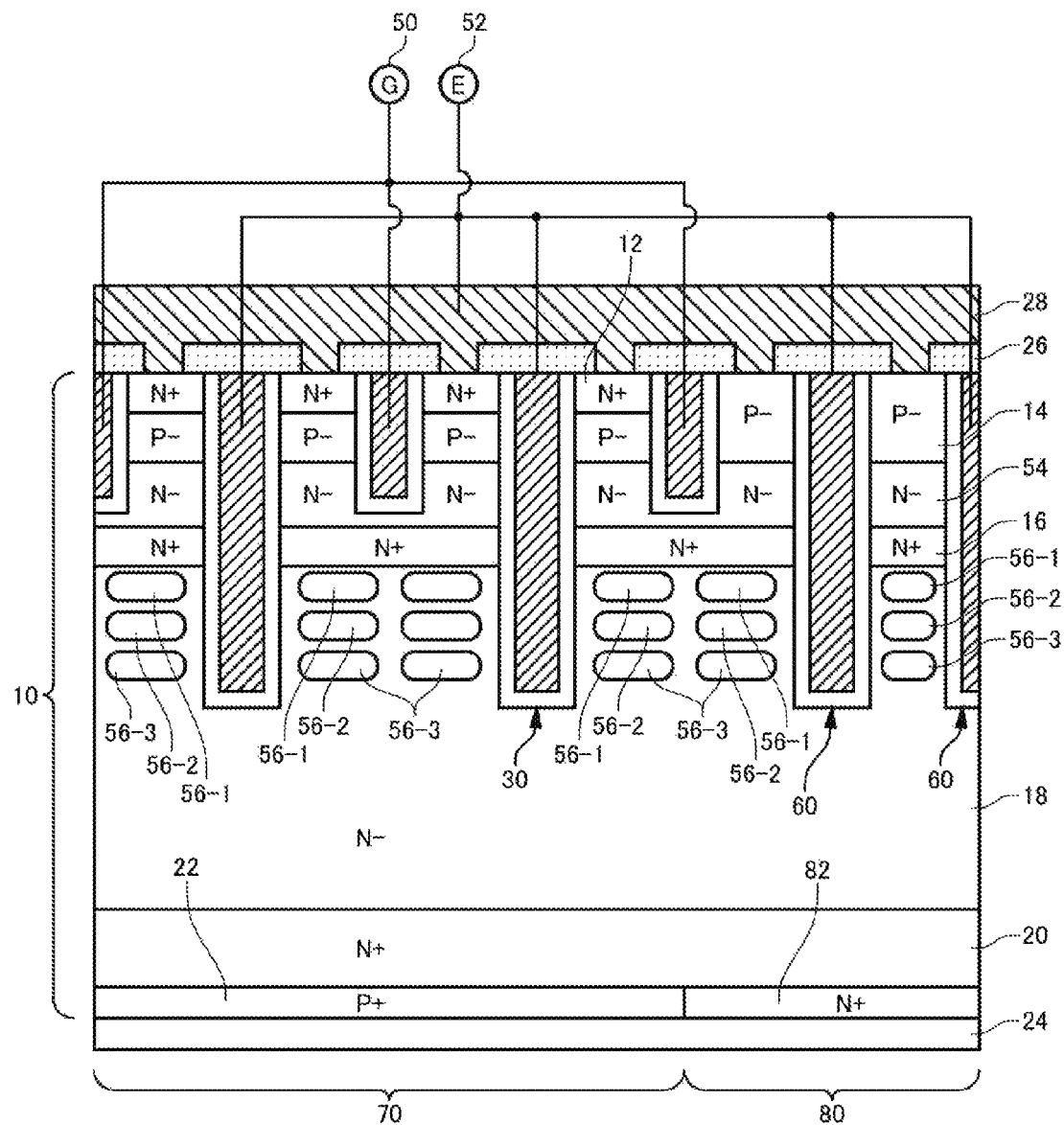
FIG. 25 is a cross-sectional view showing an exemplary structure of a semiconductor device 100 relating to a thirteenth embodiment.

FIG. 25 is a cross-sectional view showing an exemplary structure of a semiconductor device 100 relating to a thirteenth embodiment. In the semiconductor device 100 relating to the present example, the floating regions 56 are differently arranged than in the twelfth embodiment shown in FIG. 24. Except for such differences, the thirteenth embodiment is the same as the twelfth embodiment.

In the present example, a plurality of floating regions 56 are arranged at a plurality of levels in the depth direction in the regions between the dummy trenches 30 and also arranged at a plurality of sites in the lateral direction perpendicular to the depth direction.

The floating regions 56 may be differently positioned in the lateral direction below the openings in the insulating layer 26. In this case, the floating regions 56 may be formed in such a manner that the insulating layer 26 is formed, the contact openings are formed for the emitter electrode 28 and impurities are then injected by using the insulating layer 26 as a mask. In this way, the floating regions 56 can be easily formed. Here, the floating regions 56 that are adjacent to each other in the lateral direction may be combined with each other.

Regarding the semiconductor devices 100 described with reference to FIGS. 20 to 25, the diode portion 80 may not require the accumulation region 16 and the floating region 56. In addition, the arrangements of the floating regions 56 shown in FIGS. 24 and 25 can be applied to the eleventh embodiment shown in FIG. 23.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10 . . . semiconductor substrate, 12 . . . emitter region, 14 . . . base region, 15 . . . contact region, 16 . . . accumulation region, 18 . . . drift layer, 20 . . . buffer layer, 22 . . . collector layer, 24 . . . collector electrode, 26 . . . insulative layer, 28 . . . emitter electrode, 30 . . . dummy trench, 32 . . . insulating film, 34 . . . electrically conductive portion, 36 . . . front-side portion, 38 . . . bottom-side portion, 40 . . . gate trench, 41 . . . opposing portion, 42 . . . insulating film, 43 . . . protruding portion, 44 . . . electrically conductive portion, 45 . . . connecting portion, 50 . . . gate terminal, 52 . . . emitter terminal, 54 . . . low-concentration region, 55, 57, 59 . . . contact hole, 56 . . . floating region, 60 . . . emitter trench, 62 . . . insulating film, 64 . . . electrically conductive portion, 70 . . . transistor portion, 80 . . . diode portion, 82 . . . cathode layer, 90 . . . branch portion, 92 . . . insulating film, 94 . . . electrically conductive portion, 100 . . . semiconductor device, 110 . . . back-surface trench, 112 . . . insulating film, 114 . . . electrically conductive portion, 120 . . . back-surface trench, 200 . . . semiconductor device, 230 . . . dummy trench, 240 . . . gate trench, 260 . . . emitter trench

What is claimed is:

1. A semiconductor device comprising:
a semiconductor substrate;
a base region formed in the semiconductor substrate on a front surface side thereof;
a gate trench extending from a front surface side of the base region and penetrating thorough the base region;
a dummy trench extending from the front surface side of the base region and penetrating thorough the base region, a portion of the dummy trench that extends beyond a back surface of the base region being longer than a portion of the gate trench that extends beyond the back surface of the base region;
an accumulation region formed on a back surface of the base region, the accumulation region having a different conductivity type than the base region;
an emitter electrode provided on a front surface side of the base region; and
a floating region formed to face a back surface of the accumulation region, the floating region having a same conductivity type as the base region and being not electrically connected to the emitter electrode, wherein
the floating region is positioned closer, in a depth direction, to the base region than a bottom of the dummy trench is.

2. The semiconductor device as set forth in claim 1, wherein
a portion of the base region through which the gate trench is formed has the same thickness as a portion of the base region through which the dummy trench is formed.

3. The semiconductor device as set forth in claim 1, further comprising
an emitter electrode provided in the base region on a front surface side thereof, wherein
the dummy trench is connected to the emitter electrode.

4. The semiconductor device as set forth in Claim 1 wherein
the accumulation region is positioned closer to the base region than the bottom of the dummy trench is.

5. The semiconductor device as set forth in claim 4, wherein
the accumulation region is positioned closer to a back surface of the semiconductor device than a bottom of the gate trench is and spaced away from the gate trench.

6. The semiconductor device as set forth in claim 5, further comprising
a low-concentration region formed between the accumulation region and the bottom of the gate trench, the low-concentration region having the same conductivity type as the accumulation region and a lower impurity concentration than the accumulation region.

7. The semiconductor device as set forth in claim 1, wherein
on the front surface side of the semiconductor substrate, an opening width of the gate trench is smaller than an opening width of the dummy trench.

8. The semiconductor device as set forth in claim 1, wherein
the gate trench includes:
a groove formed in the semiconductor substrate on the front surface side thereof;
an insulating film formed on an inner wall of the groove; and
an electrically conductive portion formed inside the insulating film within the groove, wherein
the insulating film formed at a bottom of the groove is thicker than the insulating film formed at an opening of the groove at the front surface of the semiconductor substrate.

9. The semiconductor device as set forth in claim 4 wherein
the gate trench includes:
a groove formed in the semiconductor substrate on the front surface side thereof;
an insulating film formed on an inner wall of the groove; and
an electrically conductive portion formed inside the insulating film within the groove, wherein
the insulating film positioned closer to a bottom of the groove than the accumulation region is is at least partially thicker than the insulating film positioned closer to an opening of the groove than the accumulation region is.

10. The semiconductor device as set forth in claim 3, wherein
the dummy trench includes:
a front-side portion extending from the front surface of the semiconductor substrate; and a bottom-side portion provided closer to a bottom of a groove than the front-side portion, the bottom-side portion having a larger width than the front-side portion.

11. The semiconductor device as set forth in claim 3, wherein
the gate trench and the dummy trench each include:
a groove formed in the semiconductor substrate on the front surface side thereof;
an insulating film formed on an inner wall of the groove; and
an electrically conductive portion formed inside the insulating film within the groove, wherein
the insulating film formed at a bottom of the dummy trench is thicker than the insulating film in the gate trench.

12. The semiconductor device as set forth in claim 1, wherein
the semiconductor substrate includes:
a transistor portion having the base region, the gate trench and the dummy trench formed therein; and
a diode portion having the base region and an emitter trench formed therein, wherein
the emitter trench extends from the front surface side of the base region and penetrates through the base region.

13. The semiconductor device as set forth in claim 12, wherein
the diode portion has a plurality of the emitter trenches that extend different lengths beyond the back surface of the base region.

14. The semiconductor device as set forth in claim 13, wherein
at least one of the emitter trenches extends the same length beyond the back surface of the base region as the gate trench extends beyond the back surface of the base region, and
another at least one of the emitter trenches extends the same length beyond the back surface of the base region as the dummy trench extends beyond the back surface of the base region.

15. The semiconductor device as set forth in claim 12, wherein
the diode portion has a plurality of the emitter trenches that extend the same length beyond the back surface of the base region.

16. The semiconductor device as set forth in claim 12, wherein
a distance between adjacent ones of a plurality of the emitter trenches is the same as a distance between the gate trench and the dummy trench in the transistor portion.

17. The semiconductor device as set forth in claim 1, further comprising
a well region formed in the semiconductor substrate on the front surface side thereof, the well region being positioned closer to an edge of the semiconductor substrate than the base region is, wherein
the dummy trench has a branch portion extending in a direction parallel to an edge of the well region at the front surface of the semiconductor substrate.

18. The semiconductor device as set forth in claim 17, wherein
emitter regions of a first conductivity type and contact regions of a second conductivity type are alternately formed in the semiconductor substrate on the front surface side thereof, and
the branch portion is formed in one of the contact regions that is the closest to the well region.

19. The semiconductor device as set forth in claim 18, comprising
a plurality of the dummy trenches separated from each other, wherein
the branch portions of the dummy trenches are aligned with each other on the same straight line.

20. The semiconductor device as set forth in claim 17, further comprising
a back-surface trench formed in the semiconductor substrate on a back surface side thereof.

21. The semiconductor device as set forth in claim 20, wherein
the back-surface trench is positioned closer to a center of the semiconductor substrate than the branch portion of the dummy trench is.

22. The semiconductor device as set forth in claim 20, wherein
the back-surface trench is annularly formed at the back surface of the semiconductor substrate.

23. The semiconductor device as set forth in Claim 1, wherein
a plurality of the floating regions are formed at different depths between the base region and the bottom of the dummy trench.

24. The semiconductor device as set forth in Claim 1, wherein
an impurity concentration of the floating region is equal to or lower than an impurity concentration of the accumulation region.

25. The semiconductor device as set forth in claim 1, wherein
the floating region and the accumulation region are located adjacent to each other.

* * * * *